United States Patent
Koh et al.

(10) Patent No.: US 10,496,782 B2
(45) Date of Patent: Dec. 3, 2019

(54) ELEMENT MODEL AND PROCESS DESIGN KIT

(71) Applicant: RENESAS ELECTRONICS CORPORATION, Tokyo (JP)

(72) Inventors: Risho Koh, Tokyo (JP); Mitsuru Miyamori, Tokyo (JP); Katsumi Tsuneno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 71 days.

(21) Appl. No.: 15/832,256

(22) Filed: Dec. 5, 2017

(65) Prior Publication Data

US 2018/0181696 A1    Jun. 28, 2018

(30) Foreign Application Priority Data

Dec. 28, 2016    (JP) .................................. 2016-255157

(51) Int. Cl.
G06F 17/50    (2006.01)

(52) U.S. Cl.
CPC ...... G06F 17/5081 (2013.01); G06F 17/5036 (2013.01)

(58) Field of Classification Search
CPC ........................ G06F 17/5081; G06F 17/5036
USPC ........................................................ 716/111
See application file for complete search history.

(56) References Cited

U.S. PATENT DOCUMENTS

| | | | | |
|---|---|---|---|---|
| 2009/0052259 A1* | 2/2009 | Arigane | ................. | G11C 5/025 365/185.29 |
| 2011/0194344 A1* | 8/2011 | Ito | ...................... | G11C 16/0425 365/184 |
| 2014/0284712 A1* | 9/2014 | Ujiie | ..................... | H01L 21/761 257/335 |
| 2015/0228803 A1* | 8/2015 | Koezuka | .......... | H01L 29/78693 257/43 |

(Continued)

OTHER PUBLICATIONS

M. Tadayoni, et al., "Challenges of modeling the split-Gate SuperFlash memory cell with 1.1 V select transistor", 2016 International Conference on Microelectronic Test Structures, pp. 142-146.

(Continued)

*Primary Examiner* — Suchin Parihar
(74) *Attorney, Agent, or Firm* — McDermott Will & Emery LLP

(57) ABSTRACT

According to an embodiment, element models include a first transistor model, a second transistor model, and a variable resistor model. The first transistor model simulates a characteristic of a selection gate transistor whose channel resistance is changed by a selection gate voltage applied to a selection gate. The second transistor model simulates a characteristic of a memory gate transistor whose channel resistance is changed by a memory gate voltage applied to a memory gate. The variable resistor model has a resistance value which is changed in accordance with the selection gate voltage and the memory gate voltage and which is set to correspond to a gap region formed in a lower part of an insulating film insulating between the selection gate and the memory gate. The variable resistor model is provided between the first transistor model and the second transistor model.

15 Claims, 18 Drawing Sheets

ELEMENT MODEL ACCORDING TO EMBODIMENT 1

(56) References Cited

U.S. PATENT DOCUMENTS

2017/0125604 A1\* 5/2017 Oshima ................ G02F 1/1368

OTHER PUBLICATIONS

Y. Taito, et al., A 28nm embedded split-Gate MONOS (SG-MONOS) flash macro for automotive achieving 6.4 GB/s read throughput by 200 MHx no-wait read operation and 2.0 MB/s write throughput at Tj of 170C, IEEE JSSC, vol. 51, No. 1, (2016), pp. 213-221.

\* cited by examiner

ELEMENT MODEL ACCORDING TO EMBODIMENT 1

FIG. 3
Vgm DEPENDENCE OF Vsg-RO CHARACTERISTIC
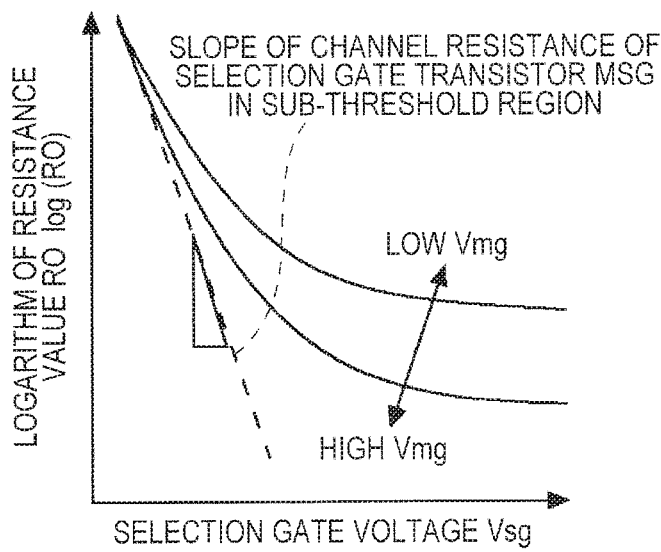
*BROKEN LINE REPRESENTS SLOPE OF CHANNEL RESISTANCE, BUT DOES NOT REPRESENT RELATION WITH VARIABLE RESISTOR MODEL RO
TEMPERATURE DEPENDENCE OF Vsg-RO CHARACTERISTIC
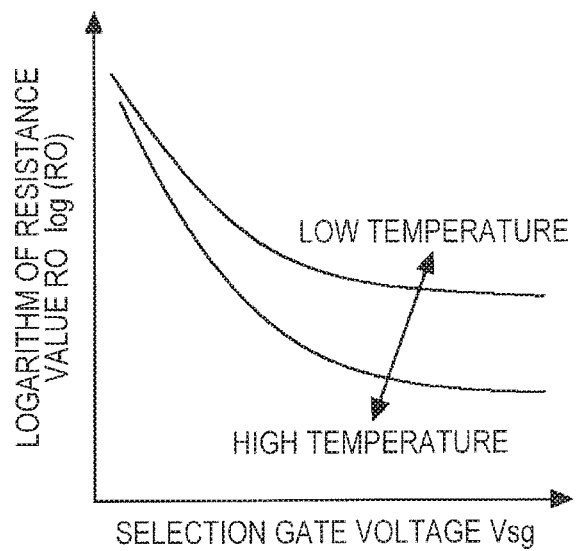

FIG. 8
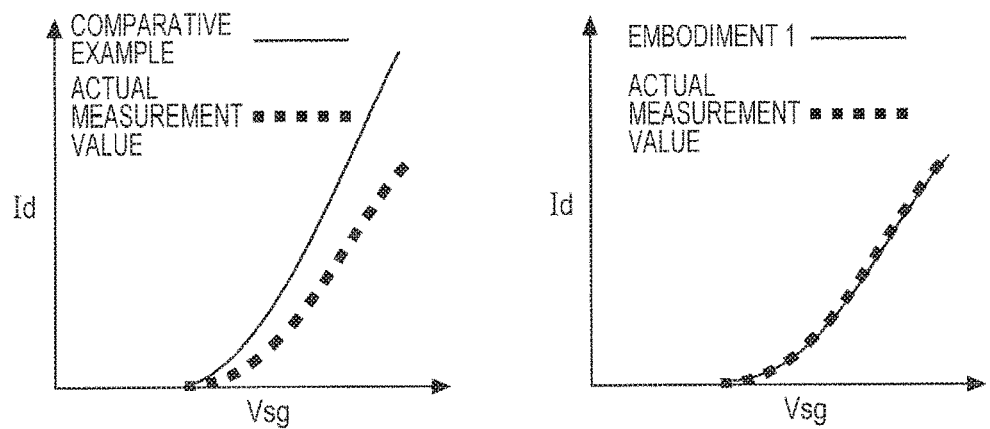
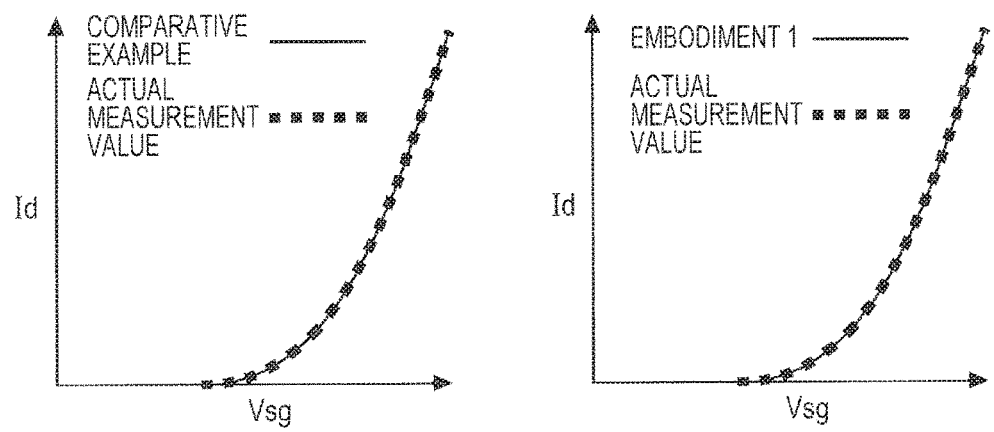
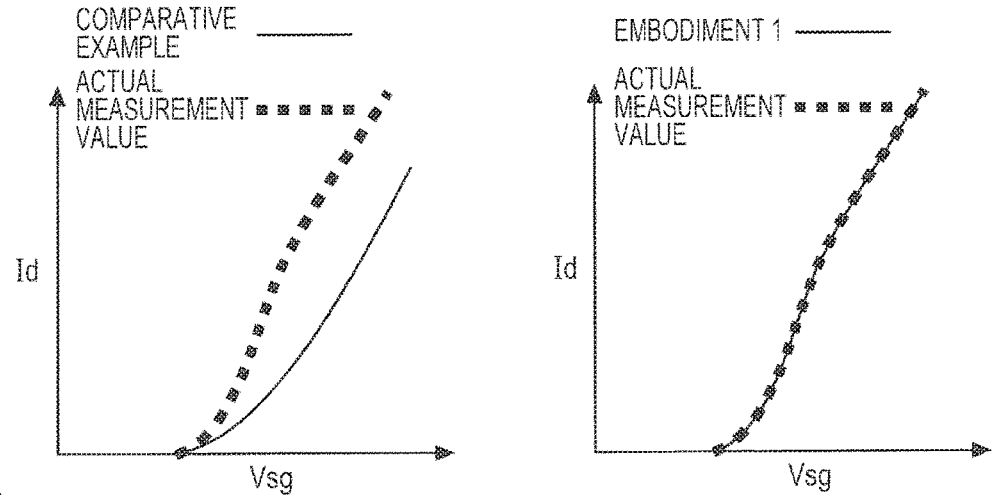

ELEMENT MODEL ACCORDING TO EMBODIMENT 2

FIG. 10
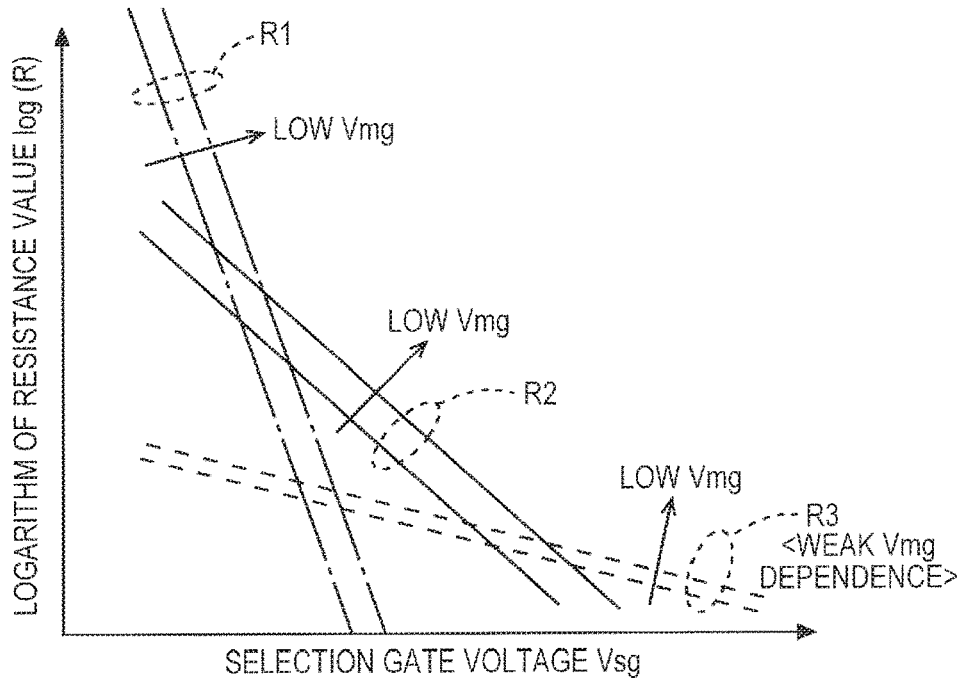
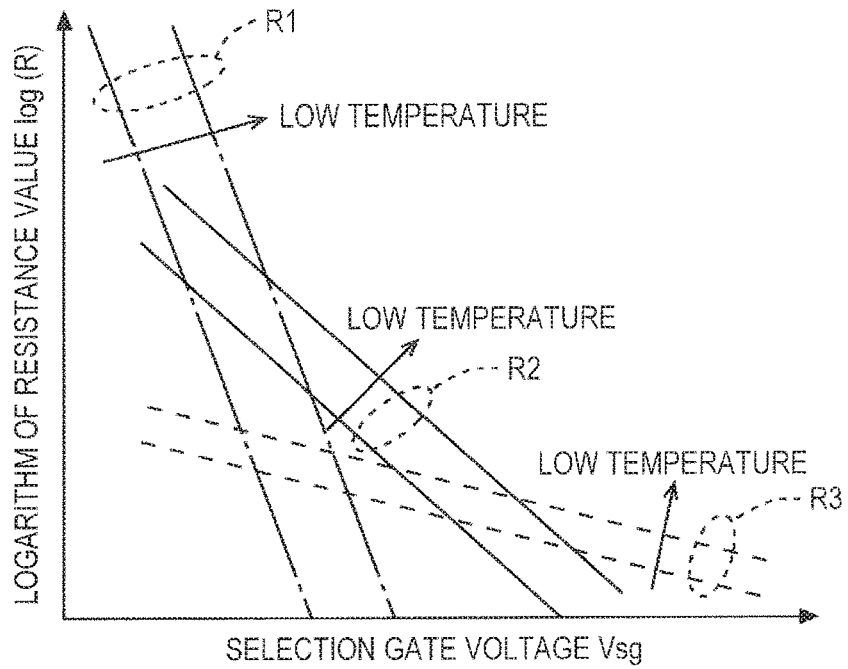

FIG. 12
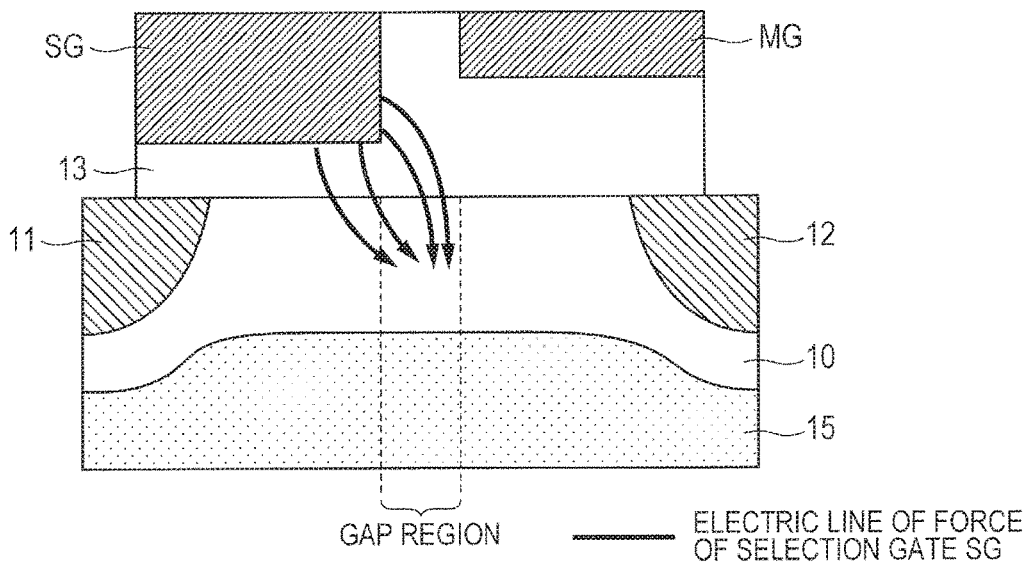
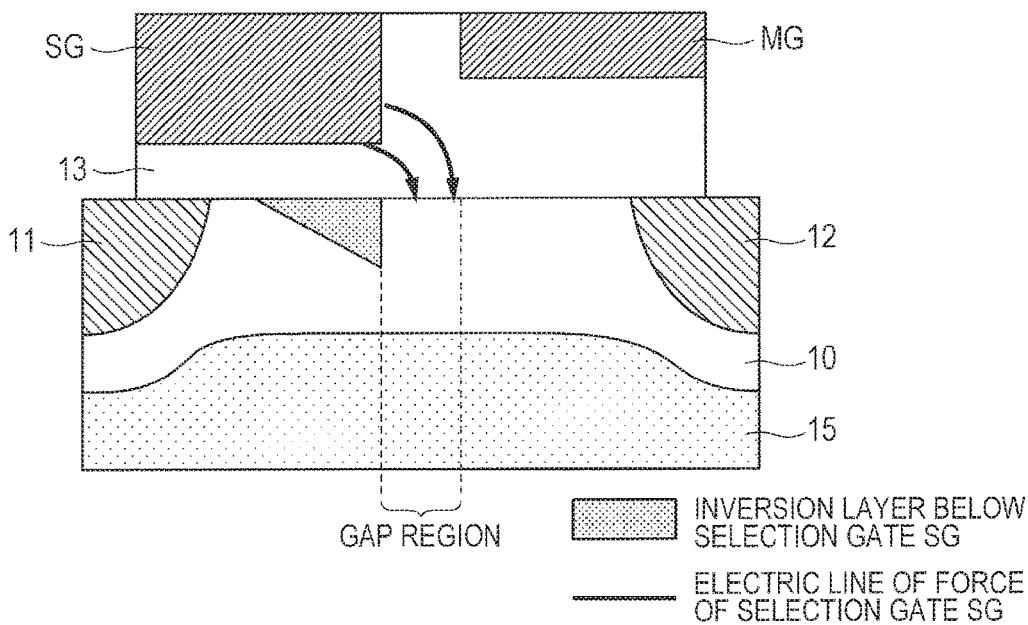

FIG. 13
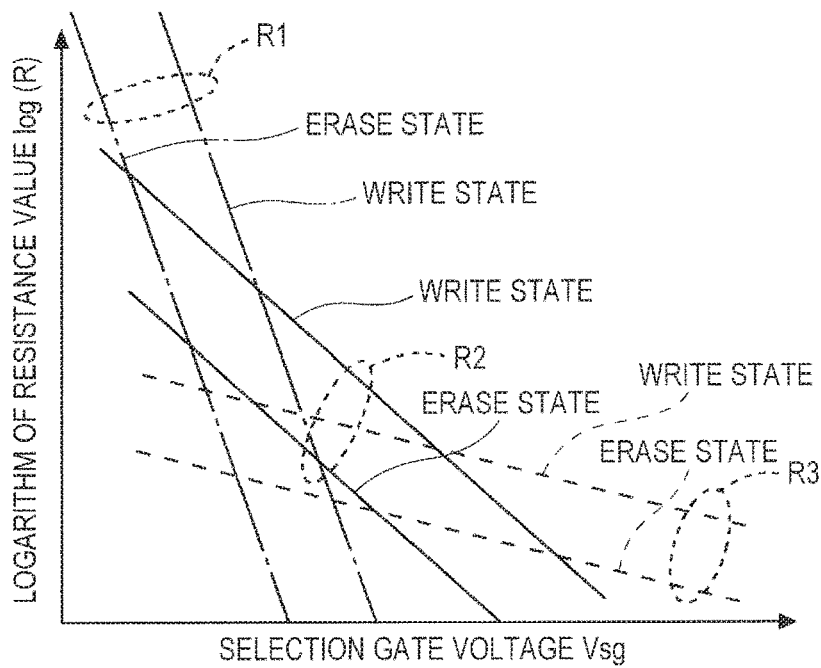
COMPARISON OF Vsg-RO CHARACTERISTICS IN WRITE STATE AND ERASE STATE (FIRST EXAMPLE)
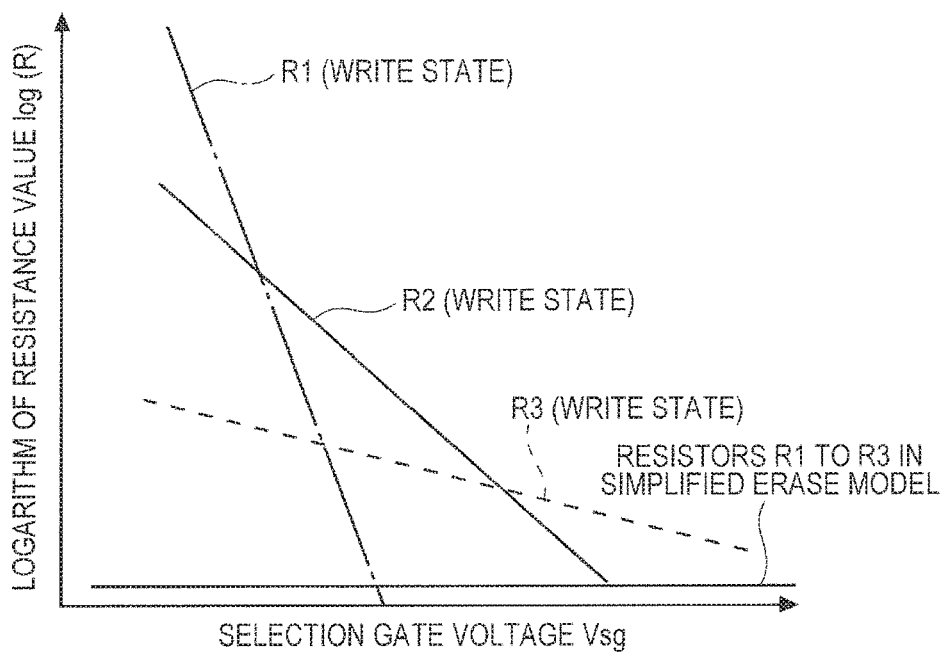
COMPARISON OF Vsg-RO CHARACTERISTICS IN WRITE STATE AND ERASE STATE (SECOND EXAMPLE)

ELEMENT MODEL ACCORDING TO EMBODIMENT 3

ELEMENT MODEL ACCORDING TO EMBODIMENT 5

ELEMENT MODEL ACCORDING TO NON-PATENT LITERATURE 1

ELEMENT MODEL ACCORDING TO COMPARATIVE EXAMPLE

US 10,496,782 B2

ELEMENT MODEL AND PROCESS DESIGN KIT

CROSS-REFERENCE TO RELATED APPLICATIONS

The disclosure of Japanese Patent Application No. 2016-255157 filed on Dec. 28, 2016 including the specification, drawings and abstract is incorporated herein by reference in its entirety.

BACKGROUND

The present invention relates to an element model and a process design kit, and, more particularly, to an element model of a memory element for a non-volatile memory having a split gate structure and a process design kit including the element model.

In a circuit design of semiconductor devices, circuit simulation is performed for executing operation verification for designed circuits before the manufacture. In this circuit simulation, the operation verification is performed, using a circuit model numerically modeling the characteristics of circuit elements, such as a transistor and a resistor. An example of this element model is disclosed in "M, Tadayoni, S. Martinie, O. Rozeau, S. Hariharanl, C. Raynaud, N. D01, "Challenges of modeling the split-Gate SuperFlash memory cell with 1.1 V select transistor", 2016 International Conference on Microelectronic Test Structures, pp. 142-146" (Non-patent Literature 1).

Non-patent Literature 1 discloses an element model having a configuration in which two MOSFET (Field Effect Transistor) models are coupled in series. The element model is used as an element model of split gate type floating gate memory element used as memory elements of a non-volatile memory, of semiconductor devices. The element model disclosed in this Non-patent Literature 1 is illustrated in FIG. 19. As illustrated in FIG. 19, in the element model disclosed in Non-patent Literature 1, an element model representing the electric characteristics of the memory element is configured, by serially coupling an FG transistor model 122 representing a MOSFET (Field Effect Transistor) corresponding to a floating gate FG and an SG transistor model 121 representing a MOSFET corresponding to a selection gate SG.

The structure of the split gate-type floating gate non-volatile memory element is as follows, as a target of modeling using the element model disclosed in Non-patent Literature 1 as a target for modeling. Based on the illustration described in Non-patent Literature 1, FIG. 20 illustrates the main structure of a floating gate type split gate memory element. As illustrated in FIG. 20, in the floating gate-type memory, a drain diffusion region 11 and a source diffusion region 12 are formed along the surface of a silicon substrate 10. The floating gate FG is formed in an upper layer of the silicon substrate 10. An insulating film 13 is formed between the floating gate FG and the silicon substrate 10. A control gate CG is formed in the upper layer of the floating gate FG through the insulating film 13.

The selection gate SG is formed adjacent to the floating gate FG, in the upper layer of the silicon substrate 10 through the insulating film 13. The drain diffusion region 11 and the source diffusion region 12 are formed in a manner that a region of the semiconductor substrate is sandwiched therebetween. This semiconductor substrate is covered by the floating gate FG and the selection gate SG which are provided adjacent to each other through the insulating film 13. In arrangement of each gate, there is formed a gap region over which none of the selection gate SG and the floating gate FG are formed over the surface of the silicon substrate 10. Data of "0" or "1" is stored in accordance with whether charges are accumulated in the floating gate FG. In a typical example, "0" is stored in a write state in which electrons are injected into the floating gate FG, whereas "1" is stored in an erase state in which electrons in the floating gate FG are erased.

The memory element disclosed in Non-patent Literature 1 is called a split gate type memory element, because the control gate CG for selecting a cell and the floating gate FG for storing data are separated. Thus, a part of the drain diffusion region 11 or the source diffusion region 12 may reach the lower part of the floating gate FG or the selection gate SG. In any method, of the two diffusion regions, either of the drain diffusion region 11 and the source diffusion region 12 is provided on the side of the floating gate FG.

Though no description is made to the element model, "Y. Taito, T. Kono, M. Nakano, T. Saito, T. Ito, K. Noguchi, H. Hidaka, T. Yamauchi, "A 28 nm embedded split-Gate MONOS (SG-MONOS) flash macro for automotive achieving 6.4 GB/s read throughput by 200 MHx no-wait read operation and 2.0 MB/s write throughput at Tj of 170C, IEEE JSSC, vol. 51, pp. 213-221" discloses a structure of a split gate type MONOS (Metal-Oxide-Nitride-Oxide-Silicon) memory element. The split gate type MONOS memory element is a non-volatile memory element whose physical recording method for data is different from that of the split gate type floating gate memory element disclosed in Non-patent Literature 1.

The MONOS non-volatile memory element has a structure in which a charge trap layer and a memory gate MG provided in the upper part thereof are laminated, instead of a laminated structure of the floating gate FG and the control gate CG of the floating gate memory element. In the floating gate memory element, charges are accumulated in the floating gate to store data, while, in the MONOS non-volatile memory element, charges accumulated in the charge trap layer are controlled to perform a storage operation. Particularly, the memory element disclosed in Non-patent Literature 2 is called a split gate side-type MONOS element, because the selection gate SG and the memory gate MG are separated.

Descriptions will now specifically be made to the structure of the split gate type MONOS non-volatile memory element disclosed in Non-patent Literature 2. FIG. 21 illustrates a cross sectional view of the memory element disclosed in Non-patent Literature 2. As illustrated in FIG. 21, the split gate type MONOS non-volatile memory element has the drain diffusion region 11 and the source diffusion region 12 formed in the silicon substrate 10. In addition, the selection gate SG and the memory gate MG are formed in the upper layer of the silicon substrate 10 to cover a region in a range from the drain diffusion region 11 to the source diffusion region 12.

The selection gate SG and the memory gate MG are in contact with the silicon substrate 10 through the insulating film 13. The selection gate SG and the memory gate MG are insulated by the insulating film 13. In the example illustrated in FIG. 21, the thickness of the insulating film 13 in the lower part of the memory gate MG is greater than the thickness in the lower part of the selection gate SG. In the split gate type MONOS memory, in arrangement of each gate, there is formed a gap region over which none of the selection gate SG and the memory gate MG are formed over the surface of the silicon substrate 10. The insulating film 13 positioned in the lower part of the selection gate SG forms a gate insulating film for the selection gate SG, while the insulating film 13 positioned in the lower part of the memory gate MG forms a gate insulating film for the memory gate MG.

In a part region included in the insulating film 13, a charge trap layer is provided. As an example, the charge trap layer is provided in the insulating film 13 in the lower part of the memory gate MG. As an example of the charge trap layer, the insulating film 13 in the lower part of the memory gate MG is a laminated film in which a silicon oxide film, a silicon nitride film, and a silicon oxide film are laminated sequentially from the bottom. By so doing, there is formed a charge trap layer accumulating charges by the trap in the interface or the insulating film. The MONOS memory controls a state of carriers TE accumulated in the charge trap layer, thereby controlling whether to store data 1 or data 0. As an example, a state in which electrons are held as the carriers TE in the charge trap layer is the write state corresponding to a state in which data 0 is stored, while a state in which positive holes are injected in the charge trap layer is an erase state corresponding to a state in which data 1 is stored. In the erase state, the positive holes are held in the charge trap layer, or at least a part of the electrons injected into the charge trap layer in the write state are electrically neutralized. In any case, in the erase state, a reduction is made in the influence of the electrons accumulated in the charge trap layer in the write state, on a threshold voltage of the memory gate transistor and an element current of the memory cell. As described above, the polarity of charges of the charge trap layer corresponds to the case where the field effect transistor including the memory gate is of the N-type. However, the polarities of the transistor and the charges may entirely be inverted.

The selection gate SG of the MONOS split gate-type non-volatile memory may be described as a control gate in some literatures. However, it corresponds to the selection gate SG of the split gate type non-volatile memory functionally having the floating gate. Therefore, it is described as the selection gate SG in this specification.

The split gate type MONOS non-volatile memory element disclosed in Non-patent Literature 2 has excellent characteristics in integration, reliability, and high-speed property, as compared to any other non-volatile memory elements.

SUMMARY

The following analyses have been made by the present inventors, when making the present invention.

For the split gate type MONOS non-volatile memory cell disclosed in Non-patent Literature 2, as an element model of a memory cell which has the same configuration as the element model of the split gate type floating non-volatile memory cell disclosed in Non-patent Literature 1, an element model 100 according to a comparative example illustrated in FIG. 22 is formed, and a comparison is made with an actual measurement value of a cell current of the split gate type floating non-volatile memory cell. As a result, it is understood that there is generated a peculiar accuracy problem of the model under certain conditions. It is understood that the particular accuracy problem may cause micronization and remarkableness of the element, and may deteriorate the accuracy of circuit verification by circuit simulation.

Descriptions will specifically be made as follows. In the element model of the split gate type floating non-volatile memory cell illustrated in FIG. 21, a transistor model representing the floating gate is replaced by a transistor model representing the memory gate of the split gate type MONOS non-volatile memory cell. In addition, there is formed a memory element model which is formed of serial coupling of two transistor models of the selection gate transistor model and the memory gate model. Then, a comparison is made with an actual measurement value of a cell current of the split gate type MONOS non-volatile memory cell. As a result, it is found that there are generated particular accuracy problems, as described as the following first problem and the second problem. It is also found that there are some problems of forming the models as the following third problem ad the fourth problem.

As the first problem, it is found that there is a peculiar accuracy problem. That is, when one or both of a selection gate voltage Vsg and a memory gate voltage Vmg is set at a low value, the actual measurement value of the cell current of the split gate-type floating non-volatile memory cell is lower than a current value represented by the element model 100 according to the comparative example.

As the second problem, it is found that there is a peculiar accuracy problem in the element model 100 according to the comparative example. That is, an error is generated in reproducibility of temperature dependency in the cell current of the split gate type floating non-volatile memory cell.

As the third problem, there is a practical problem, as will now be described. The selection gate transistor and the memory gate transistor included in a split gate FMONOS memory cell have a different feature that there is no diffusion layer of a coupling unit therebetween and a different feature that the gate electrode and the gate insulating film have different structures, from the assumed MOSFET structure of the general MOSFET model, such as a BSIM (Berkeley Short-channel IGFET Model). In addition, there is a difference in any other various physical structures, for example, a difference in distributions of impurities to be introduced. Thus, it is considered that the selection gate transistor and the memory gate transistor included in the split gate type FMONOS memory cell have various characteristics that cannot be represented by the general MOSFET models. However, when a new model system is formed by changing the model system itself of the MOSFET model to correspond to the difference in the various physical structures, there are practical difficulties that the circuit simulation needs to correspond to the newly formed model system, in addition to the difficulty of a technique for newly forming the model system. Therefore, to perform the circuit simulation of a circuit including the split gate type FMONOS memory cell, it is desired to simultaneously solve the problem of the model accuracy and the problem of difficulty of model formation or practical difficulty.

As the fourth problem, in the element model 100 according to the comparative example, it is not possible to represent a difference in the characteristics of the model representing the cell current in the erase state of the split gate-type MONOS non-volatile memory cell and the model representing the cell current in the write state, even if a threshold voltage parameter of the memory gate transistor model and other few model parameters are changed. It is understood, particularly, that it is necessary to change many model parameters for the memory gate transistor model. From the point of view of model formation, it is desired to realize generation of one model from another model, of the model representing the cell current in the erase state and the model representing the cell current in the write state, by changing only some parameters as few as possible.

The cell current is a current flowing through the memory element, and is a current flowing between the drain diffusion region 11 and the source diffusion region 12 in the memory cell illustrated, for example, in FIG. 21. In the case of the element disclosed in Non-patent Literature 2, a drain current of the selection gate transistor may be assumed as a cell current. In this specification, the field effect transistor (MOSFET) formed with the selection gate is referred to as a selection gate transistor, while the field effect transistor (MOSFET) formed with the memory gate is referred to as a memory gate transistor. In addition, the model representing the characteristics of the current value of the selection gate transistor is referred to as a selection gate transistor model, while the model representing the characteristics of the current value of the memory gate transistor is referred to as a memory gate transistor model. A voltage to be applied to the selection gate is referred to as a selection gate voltage, while a voltage to be applied to the memory gate is referred to as a memory gate voltage. The transistor in this specification indicates a field effect transistor (MOSFET). In this specification, the cell current indicates a read current, the cell current in a write state indicates a read current for a cell in the write state, and the cell current in the erase state indicates a read current for a cell in an erase state.

According to an embodiment, there is provided model comprising: a first transistor model which simulates a characteristic of a selection gate transistor whose channel resistance is changed by a selection gate voltage applied to the selection gate; a second transistor model which simulates a characteristic of a memory gate transistor whose channel resistance is changed by a memory gate voltage applied to the memory gate; and a variable resistor model whose resistance value is changed in accordance with the selection gate voltage and the memory gate voltage and set to correspond to a gap region formed in a lower part of an insulating film insulating between the selection gate and the memory gate. The variable resistor model is provided between the first transistor model and the second transistor model.

According to the above-described embodiment, it is possible to enhance the accuracy of the circuit simulation of a circuit including a memory element.

BRIEF DESCRIPTION OF THE DRAWINGS

FIG. 3 is a diagram for explaining the characteristics set for a variable resistor for use in the memory element according to the embodiment 1.

FIG. 8 is a diagram for explaining the characteristics of the element model of the memory element according to the embodiment 1.

FIG. 10 is a diagram for explaining the memory gate voltage dependence and the temperature dependence of three variable resistors in the element model of the memory element according to the embodiment 2.

FIG. 12 is a diagram for explaining a difference in the electric field due to a difference in the selection gate voltage of the memory element according to the embodiment 2.

FIG. 13 is a diagram for comparing the resistance characteristics of the variable resistors for use in the memory element according to the embodiment 2, between a write state and an erase state.

DETAILED DESCRIPTION

Figure 1:
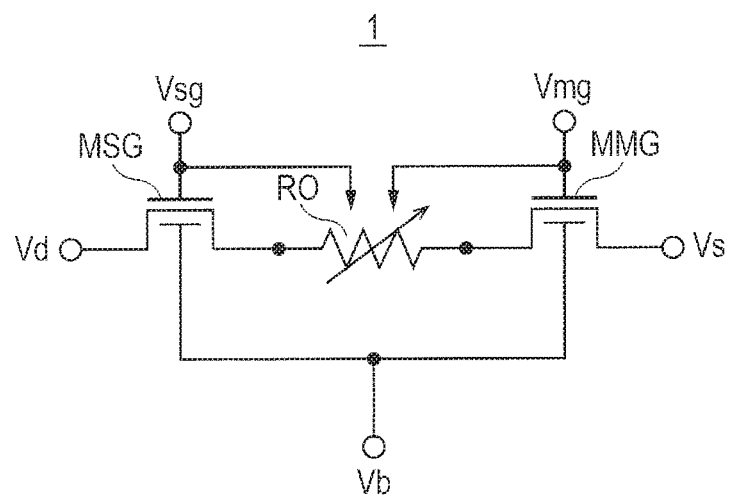
FIG. 1 is a diagram for explaining an element model of a memory element according to an embodiment 1.

For clarification of descriptions, the following description and accompanying drawings are adequately omitted and simplified. In the drawings below, the same constituent elements are identified by the same reference symbols, and thus may not be described over and over as needed.

Embodiment 1

Descriptions will hereinafter be made to an element model numerically simulating an operation of a circuit element in a design supporting device (for example, a circuit simulator). The element model to be described relates to a MONOS (Metal-Oxide-Nitride-Oxide-Silicon) memory as one split gate type memory which functions as a memory element in the memory device, for example. Descriptions will be made to a floating gate memory of the split gate-type memory in another embodiment.

As illustrated in FIG. 1, an element model 1 according to the embodiment 1 has a first transistor model (for example, a selection gate transistor model MSG), a second transistor model (for example, a memory gate transistor model MMG), and a variable resistor model R0.

The element model 1 according to the embodiment 1 includes a selection gate transistor model MSG representing the selection gate transistor, a variable resistor model R0, and a memory gate transistor model MMG representing the memory gate transistor, which are coupled in series as illustrated in FIG. 1. In the element model 1 according to the embodiment 1, the resistance value of the variable resistor model R0 is set to depend both on a selection gate voltage Vsg and a memory gate voltage Vmg. Further, the resistance value of the variable resistor model R0 is set to decrease as the selection gate voltage Vsg increases, and the resistance value of the variable resistor model R0 is set to decrease in accordance with an increase in the memory gate voltage Vmg.

In the element model 1 according to the embodiment 1, dependence of the selection gate voltage Vsg of the resistance value of the variable resistor model R0 is set lower than that of channel resistance of the selection gate transistor in a sub-threshold region of the selection gate transistor. In the embodiment model 1 according to the embodiment 1, the resistance value of the variable resistor model R0 is set to decrease as an element temperature increases, and the resistance value of the variable resistor model R0 is set to decrease as the element temperature increases even on a condition of a high selection gate voltage Vsg.

In the element model 1 according to the embodiment 1, the selection gate transistor model MSG simulates the characteristic of the selection gate transistor that the channel resistance is changed due to the selection gate voltage Vsg applied to the selection gate SG. The memory gate transistor model MMG simulates the characteristic of the memory gate transistor that the channel resistance is changed due to the memory gate voltage Vmg applied to the memory gate MG. The variable resistor model R0 is a resistor model in which the resistance value is changed in accordance with the selection gate voltage Vsg and the memory gate voltage Vmg and set to simulate a gap region formed in the lower part of the insulating film 13 which insulates the selection gate SG and the memory gate MG.

In the element model 1 according to the embodiment, a problem peculiar to the model accuracy in the split gate-type floating non-volatile memory cell is solved using a simple method including adding of a variable resistor R0 model representing a few factors which are specified as dominant factors by the inventors. Thus, for the selection gate transistor model MSG and the memory gate transistor model MMG, it is possible to use an existing form of MOSFET model, such as BSIM4, and there is no need to use the MOSFET model whose form has been changed from the existing form. It is possible to solve the problem peculiar to the model accuracy, without changing a simulation method, such as correction of the circuit simulation, at the time of using the MOSFET model having a form different from the existing MOSFET model.

Descriptions will hereinafter be made to the principle of the present invention. In this specification, descriptions will be made to the case where the selection gate transistor and the memory gate transistor are both of the N-channel type. The present invention may also be applied to an element with the inverted polarity.

Figure 2:
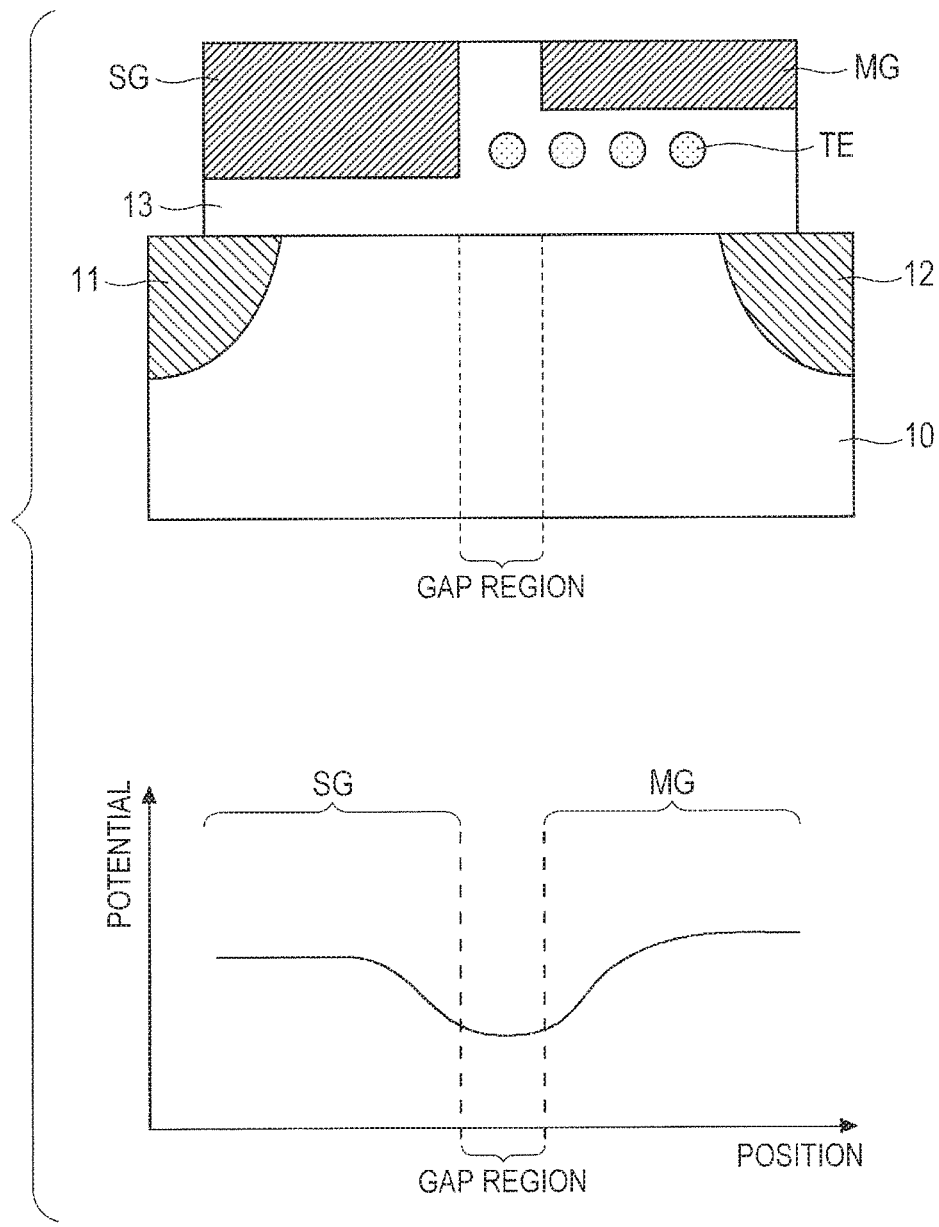
FIG. 2 is a cross sectional view and a graph for explaining the memory element according to the embodiment 1.

The graph in the lower illustration of FIG. 2 shows the result of a channel potential distribution of the surface of the silicon substrate 10, based on an analysis by the inventors using a two-dimensional device simulator, for the split gate-type MONOS non-volatile memory (for example, the upper illustration of FIG. 2) in a write state. As illustrated in the lower illustration of FIG. 2, it is recognized that there is a decrease in the potential of the surface of the silicon substrate 10 in the gap region and in a position corresponding to the vicinity thereof. This implies that there are a decrease in the potential in the gap region and in the vicinity thereof and a decrease in the carrier concentration contributing to electrical conduction, that a potential barrier for carriers is formed, and that parasitic resistance is formed in the vicinity of the gap region.

In the present invention, the characteristics of the bias dependence or the temperature dependence of the parasitic resistance formed in the vicinity of the gap region are modeled as a parasitic resistance model R0. The parasitic resistance model is incorporated in the element model, thereby improving the accuracy of the memory element model. The variable resistor model R0 is inserted between the transistor model representing the selection gate transistor and the transistor model representing the memory gate transistor. By so doing, the parasitic resistance formed in the vicinity of the gap region is represented in a physically correct form, including its position.

In the device simulation described in this specification, the charge trap layer is put in the lower part of the memory gate. In addition, it is assumed that the charge trap layer extends up to the middle part of the memory gate and the selection gate, and that charges trapped in the charge trap layer in the write state are distributed in a range including the lower part of the memory gate and a partial region of the upper part of the gap region.

First to Third Characteristics

In the present invention, the characteristics of the parasitic resistance formed in the vicinity of the gap region are reflected to the variable resistor model R0, thereby realizing a physically appropriate and high accuracy model. Descriptions will now be made to the first to third characteristics of the bias dependence of the parasitic resistance. It is found that the following three tendencies are especially remarkable, as a result of analysis performed by the two-dimensional device simulator based on the same setting as that of the lower illustration of FIG. 2.

First Characteristic

The parasitic resistance formed in the vicinity of the gap region is decreased in accordance with an increase in the selection gate voltage Vsg.

Second Characteristic

The parasitic resistance formed in the vicinity of the gap region is decreased in accordance with an increase in the memory gate voltage Vmg.

Third Characteristic

The parasitic resistance formed in the vicinity of the gap region has weaker dependence on the selection gate voltage Vsg than that of the channel resistance of the selection gate transistor in the sub-threshold region of the selection gate transistor.

As the characteristic related to the third characteristic, when the selection gate voltage Vsg is low, the parasitic resistance strongly depends on the selection gate voltage Vsg. When the selection gate voltage Vsg is high, the parasitic resistance weakly depends on the selection gate voltage Vsg.

As illustrated in FIG. 3, by using the variable resistor model R0 having the first to third characteristics in this embodiment, it is possible to solve or reduce a difference between the actual measurement value of the cell current of the memory element and the current value of the element model. FIG. 3 is a diagram for explaining the characteristics set for the variable resistor for use in the memory element according to the embodiment 1. The broken line visually represents only a slope when logarithmic plotting is performed for the channel resistance of the selection gate transistor in the sub-threshold region of the selection gate transistor, in relation to the voltage Vsg, and does not represent the relation between the channel resistance and the parasitic resistance of the selection gate transistor.

Figure 22:
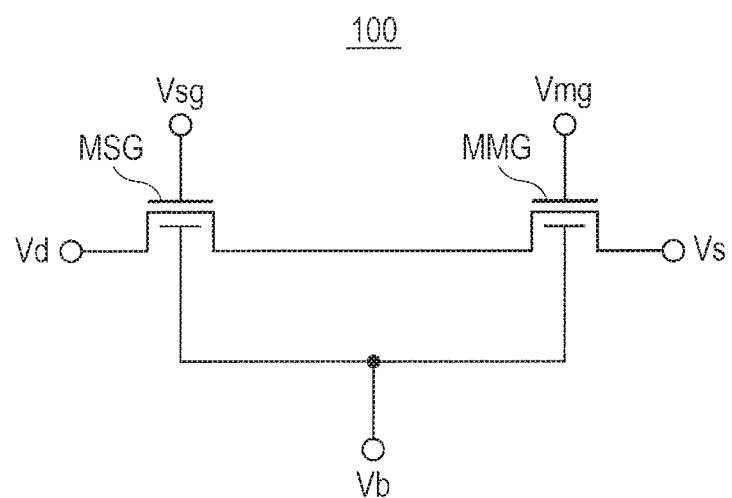
FIG. 22 is a diagram for explaining an element model of a memory element according to a comparative example.

Subsequently, descriptions will now be made to a simulation result when the element model 1 according to the embodiment 1 is used. In this case, descriptions will be made to an effect of the present invention, with descriptions of the simulation accuracy of the element model 1 according to the embodiment 1, by reference to the element model 100 without the variable resistor model R0 as a comparative example. FIG. 22 illustrates a diagram for explaining the element model 100 of the memory element according to the comparative example. As illustrated in FIG. 22, the element model 100 according to the comparative example has the selection gate transistor model MSG and the memory gate transistor model MMG which are coupled in series, and is formed by excluding the variable resistor model R0 from the element model 1 according to the embodiment 1 illustrated in FIG. 1.

Figure 4:
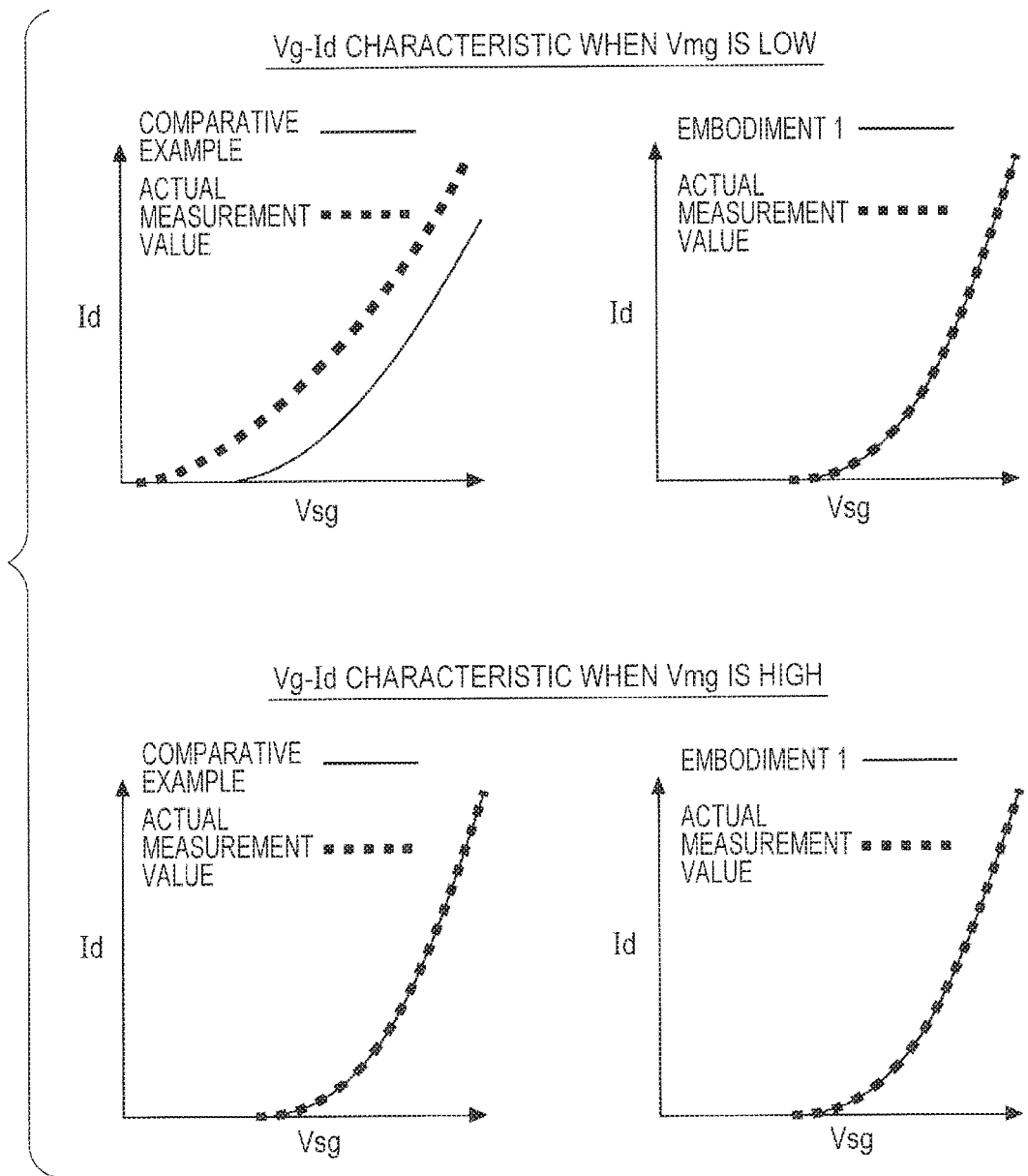
FIG. 4 is a diagram for explaining the characteristics of an element model of the memory element according to the embodiment 1.

FIG. 4 is a diagram illustrating a comparison result of a current value represented by the element model 1 according to the embodiment 1 including the variable resistor model R0 having the first to third characteristics and an actual measurement value of a cell current of the memory element, and a comparison result of a current value represented by the element model 100 according to the comparative example and an actual measurement value of a cell current of the memory element.

As illustrated in FIG. 4, in the element model 100 according to the comparative example without the variable resistor model R0, it is possible to represent the cell current in the simulation result, when the memory gate voltage Vmg is high. However, when the memory gate voltage Vmg is low, a difference is generated between the drain current characteristic of the actual memory element and the simulation result. In the element model 1 according to the embodiment 1, regardless of the level of the memory gate voltage Vmg, the drain current characteristic of the actual memory element coincides with the drain current characteristic obtained by simulation. This effect is obtained by introducing the variable resistor model R0 representing the characteristic of the parasitic resistance in the gap region, in the element model 1 according to the embodiment 1. In the element model 1 according to the embodiment 1, the variable resistor model R0 is coupled between the selection gate transistor model MSG and the memory gate transistor model MMG. This matches with a physical structure that the parasitic resistance of the gap region exists between the selection gate transistor and the memory gate transistor. Thus, it is possible to appropriately represent a coupling point voltage between the selection gate transistor and the memory gate transistor which are coupled to the parasitic resistance of the gap region.

Descriptions will now specifically be made to the origins of the first to third characteristics, and the necessity and effect of incorporating the characteristics into the model.

Figure 5:
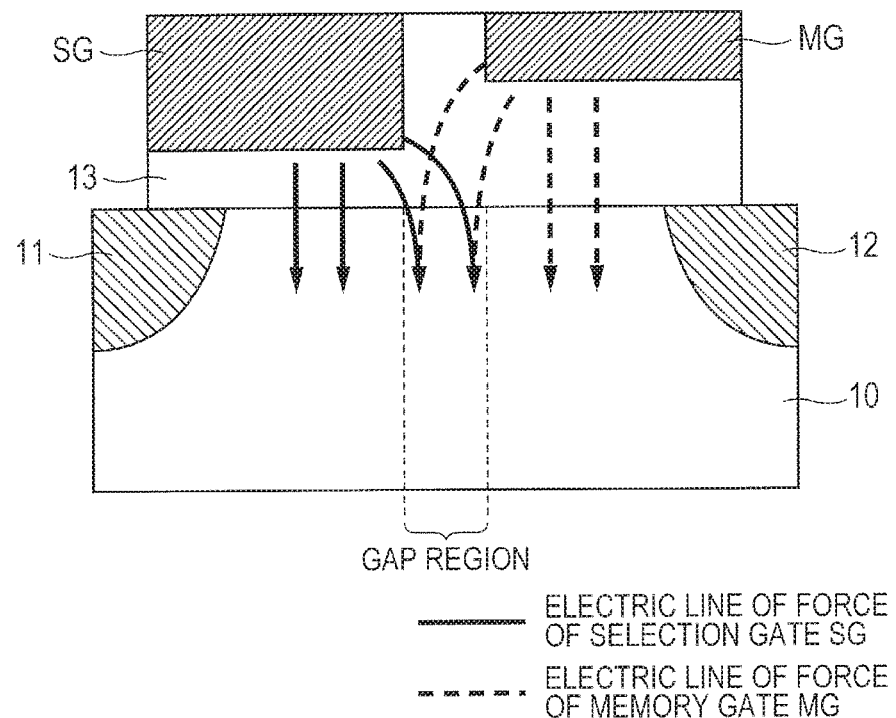
FIG. 5 is a diagram for explaining the influence of an electric field in the memory element according to the embodiment 1.

FIG. 5 is a diagram for explaining the influence of the electric field in the memory element according to the embodiment 1. The solid arrows in FIG. 5 represent electric lines of force from the selection gate SG to the channel formation region of the surface of the silicon substrate 10. The dashed arrows in FIG. 5 represent electric lines of force from the memory gate MG to the channel formation region of the surface of the silicon substrate 10.

As illustrated in FIG. 5, both of the electric lines of force of the selection gate SG and the electric lines of force of the memory gate MG reach the gap region. That is, the potential of the surface of the gap region is influenced by both of the electric lines of force of the selection gate SG and the electric lines of force of the memory gate MG. As a result of this, it is necessary to form a model in a manner that the parasitic resistance formed in the gap region depends on both of the selection gate voltage Vsg and the memory gate voltage Vmg. However, in the model using the general MOSFET model, it is not possible to represent the characteristic of the dependence on two gate voltages. In the element model 1 according to the embodiment 1, to overcome this problem, the resistance characteristic peculiar to this gap region is represented, by inserting and serially coupling the variable resistor model between the selection gate model and the memory gate model. This variable resistance model has a resistance value which depends on both of the selection gate voltage Vsg and the memory gate voltage Vmg.

Figure 6:
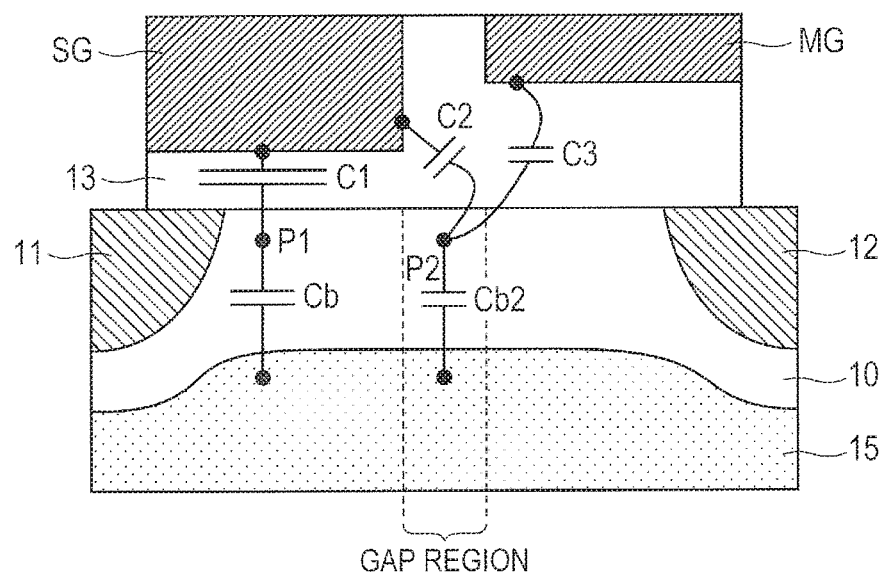
FIG. 6 is a diagram for explaining electrostatic binding in the memory element according to the embodiment 1, using a model of an equivalent capacity network.

Descriptions will now be made to the origins of the first to third characteristics and an examination result of effectiveness of incorporating the characteristics into the model using a model of an equivalent capacity network of FIG. 6. FIG. 6 illustrates a model of an equivalent capacity network representing electrostatic binding in the memory element.

The potential of a surface P1 of the silicon substrate 10 in the lower part of the selection gate SG is defined by capacitance division of gate capacitance C1 and substrate capacitance Cb. The potential of a surface P2 of the gap region is defined by capacitance division of capacitance C2, capacitance C3, and substrate capacitance Cb2 in the gap region. The capacitance C2 is formed between the selection gate SG and the surface P2 of the gap region. The capacitance C3 is formed between the memory gate MG and the surface P2 of the gap region.

In this case, the surface P2 of the gap region and the selection gate SG are separated by a distance in a horizontal direction, and the electric lines of forces of the end part of the selection gate SG are spread as illustrated in FIG. 5. As a result, the electrostatic binding of the selection gate SG and the surface P2 of the gap region is weaker than electrostatic binding of the selection gate SG and the surface P1 of the silicon substrate 10 right below the selection gate SG. Thus, the capacitance C2 representing the electrostatic binding of the selection gate SG and the surface P2 of the gap region is lower than the gate capacitance C1 right below the selection gate SG.

The gate capacitance C1 and the substrate capacitance Cb are only equivalent capacitances coupled to the surface P1 right below the selection gate SG. On the other hand, in the surface P2 of the gap region, the capacitance C3 representing the electrostatic binding of the memory gate MG and the surface P2 of the gap region is also included, in addition to the capacitance C2 between the selection gate SG and the surface P2 and the substrate Cb2.

Thus, the sensitivity of the potential in the surface P2 of the gap region to the selection gate voltage Vsg is always weaker than the sensitivity of the potential in the surface P1 of the silicon substrate 10 right below the selection gate SG to the selection gate voltage Vsg. Thus, the potential in the surface P2 of the gap region weakly fluctuates in accordance with a fluctuation of the selection gate voltage Vsg, as compared with the potential in the surface P1 of the silicon substrate 10 right below the gate. This can be represented by the equations as follows:

Since $$\phi p1 = (C1 Vsg + Cb Vb)/(C1 + Cb) \quad (1),$$

$$d\phi p1/dVsg = C1/(C1 + Cb) \quad (2)$$

$$\phi p2 = (C2 Vsg + (Cb2 + C3) Vb)/(C2 + Cb2 + C3) \quad (3)$$

Thus, $d\phi p2/dVsg = C2/(C2+Cb2+C3)$ (4)

Based on a comparison between Equation (2) and Equation (4), C2 of the numerator is smaller than C1, and the denominator (C2+Cb2+C3) is greater than (C2+Cb) by C3 since there is no much difference between the value of Cb and the value of Cb2. Thus, Equation (4) represents a greater value than that of Equation (2). The above equations are satisfied in the sub-threshold region in which no inversion layer is formed. In a state where parasitic resistance is remarkable in the gap region, no inversion layer is formed in the gap region. In consideration of this, the sensitivity of the potential in the surface P2 of the gap region to the selection gate voltage Vsg is lower than the sensitivity of the potential of the channel unit P1 of the selection gate transistor to the selection gate voltage Vsg. Thus, it can be said that the parasitic resistance of the gap region, in accordance with a change in the selection gate voltage Vsg, is lower than the sensitivity of the channel resistance of the selection gate transistor in the sub-threshold region of the selection gate transistor to the selection gate voltage Vsg.

"$\phi p1$" represents the potential of P1, "$\phi p2$" represents the potential of P2, "$d\phi p1/dVsg$" is a derivative of "$\phi p1$" by "Vsg", that is, a rate of change of "$\phi p1$" with respect to the change of "Vsg", and "$d\phi p2/dVsg$" is a derivative of "$d\phi p2$" by Vsg, that is, a rate of change of "$\phi p2$" with respect to Vsg. "Vsg" represents a selection gate voltage, and "Vb" represents a substrate voltage as a voltage of the silicon substrate.

That is, sensitivity "a" of the parasitic resistance in the gap region to the selection gate voltage Vsg is represented by Equation (5) as the absolute value of a rate of change of the parasitic resistance value with respect to the change of the selection gate voltage Vsg. The sensitivity "$\alpha$" of the channel resistance of the selection gate transistor to the selection gate voltage Vsg is expressed by Equation (6) as the absolute value of a rate of change of the channel resistance of the selection gate transistor with respect to the selection gate voltage Vsg. In this case, "$\alpha$" is smaller than "$\alpha ch$". That is, the relation of Equation (7) is satisfied.

$$\alpha = |\Delta R0/\Delta Vsg| \quad (5)$$

$$\alpha ch = |\Delta Rch/\Delta Vsg| \quad (6)$$

$$\alpha ch > \alpha$$

In this case, "Rch" represents the channel resistance of the selection gate transistor.

Thus, the parasitic resistance formed in the part of the gap region more weakly depends on the voltage Vsg than the dependence of the channel resistance of the selection gate transistor formed right below the selection gate MG. This tendency clearly appears to the sub-threshold region of the selection gate transistor in which no inversion layer is formed right below the selection gate MG.

In the general MOSFET model, it is not possible to handle a unique tendency in the dependence of the parasitic resistance in this gap region on the selection gate voltage Vsg. However, in the element model 1 according to the embodiment 1, the resistor model R0 is introduced to the drain current model of the memory element. In this model, the channel resistance weakly depends on the selection gate voltage Vsg than the dependence of the selection gate voltage Vsg of the channel resistance in the sub-threshold region of the selection gate transistor. Thus, in the element model 1 according to the embodiment 1, it is possible to represent this resistance characteristic.

In the present invention, R0 is set to satisfy Equation (7) with a range of the voltage Vsg including the threshold voltage of typically at least the selection gate transistor. As a result, the inversion layer is formed in the selection gate transistor, and the inversion layer is not formed in the gap region, thereby increasing the parasitic resistance of the gap region. Thus, it is possible to represent that the parasitic resistance in the gap region more weakly depends on the voltage Vsg than the channel resistance of the selection gate transistor in the sub-threshold region of the selection gate transistor.

In FIG. 6, the memory gate and the surface P2 of the gap region are electrostatically bound. Thus, if the memory gate voltage Vmg increases, the potential of the surface P2 in the gap region increases. The increase in the memory gate voltage Vmg causes the decrease in the electric resistance formed in the gap region.

Similarly, in FIG. 6, the selection gate and the surface P2 of the gap region are electrostatically bound. Thus, if the selection gate voltage Vsg increases, the potential of the surface P2 in the gap region increases. The decrease in the memory gate voltage Vsg causes the decrease in the electric resistance formed in the gap region of the memory gate voltage Vsg.

As described above, in the model using the general MOSFET model, it is not possible to represent the characteristic about the dependence on the two gate voltages. In the element model 1 according to the embodiment 1, to overcome this problem, it is possible to represent the particular resistance characteristic in the gap region and its vicinity, by inserting and serially coupling the variable resistor model R0 between the selection gate model MSG and the memory gate model MMG. In this variable resistor model R0, the resistance value depends both on the section gate voltage Vsg and the memory gate voltage Vmg. In addition, it is possible to represent the characteristic by causing the variable resistor model R0 to have a characteristic that the selection gate voltage Vsg increases and the resistance value of the variable resistor decreases and a characteristic that the memory gate voltage Vmg increases and the resistance value of the variable resistor decreases. As a result, it is possible to improve the model accuracy as the memory element model.

In general, the MOSFET model, such as the BSIM, has a parasitic resistance parameter. The current decreases due to the parasitic resistance in the general MOSFET. This current decrease is remarkable on a condition of a high gate voltage of the MOSFET. However, the found first problem has a characteristic that the current decrease is remarkable on a condition of low gate voltage, and the general parasitic resistance cannot be represented in the MOSFET due to the sheet resistance of the source/drain diffusion layer. The general parasitic resistance remarkably has an influence on the current on a condition that the gate voltage of the MOSFET is high. This is because, when the gate voltage is high, the channel resistance of the MOSFET is low, and contribution of the parasitic resistance in the overall resistance increases. In the characteristic that the current value decreases when the gate voltage is high, modeling can be made by adjusting the general parasitic resistance parameter included in the MOSFET model, or by adding resistance corresponding to the parasitic resistance included in the element model. However, as illustrated in the upper left illustration of FIG. 4, a difference increases between the current value represented by the element model 100 according to the comparative example and the actual measurement value of the cell current of the MONOS type split gate memory, when both of the selection gate voltage Vsg and the memory gate voltage Vmg are low. The peculiar accuracy problem that cannot be represented in the general parasitic resistance is generated, that is, the first problem is generated. On the contrary, in the element model according to the embodiment 1, the difference is restrained as illustrated in the upper left illustration of FIG. 4, that is, the first problem is solved.

In the element model 1 according to the embodiment 1, the first problem is solved using an easy method including adding of the variable resistor R0 model representing a few factors which are specified as dominant factors by the inventors. For the selection gate transistor model MSG and the memory gate transistor model MMG, the existing form of the MOSFET model, such as BSIM4, can be used as is. Thus, the third problem is solved, because there is no need to change the simulation method, that is, there is no need to perform correction of the circuit simulation that is required at the time of using the MOSFET model whose form is not the existing form.

Fourth Characteristic

Figure 7:
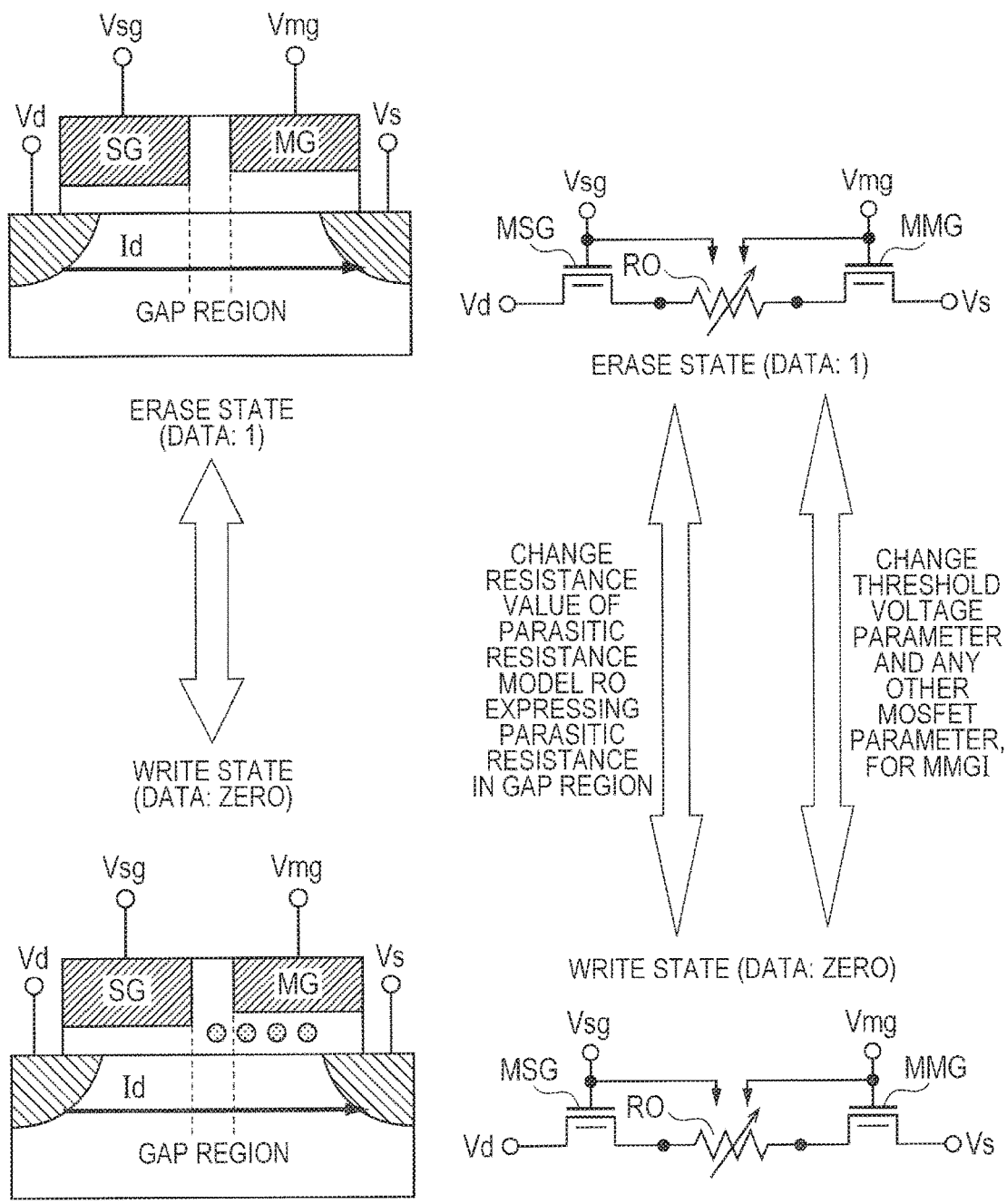
FIG. 7 is a diagram for explaining a write state and an erase state of the memory element according to the embodiment 1.

Descriptions will now be made to the characteristic regarding temperature dependence of the parasitic resistance by reference to FIG. 7, as the fourth characteristic of the parasitic resistance formed in the vicinity of the gap region. The fourth characteristic is that the resistance value of the variable resistor model R0 is set to decrease as the element temperature increases. The resistance value of the variable resistor model R0 is set to decrease as the element temperature increases even on the condition of the high selection gate voltage Vsg.

In the general field effect transistor, in a region where the gate voltage is low, the number of carriers contributing to electrical conduction increases as the temperature increases, thus decreasing the resistance on the high-temperature side. In the general field effect transistor, if the gate voltage increases, the inversion layer is formed. However, the number of carriers contributing to the electrical conduction in the inversion layer weakly depends on the temperature. At a high temperature, phonon scattering is remarkable, thus resulting in an increase in the resistance at the high temperature side.

However, because the gap region is away from both of the selection gate and the memory gate, no inversion layer is formed even if the selection gate voltage or the memory gate voltage increases. As a result, the resistance value of the variable resistor model R0 decreases as the element temperature increases, without depending on the selection gate voltage and the memory gate voltage. This result cannot be attained in the general MOSFET model. However, in the element model according to the embodiment 1, the resistance value of the variable resistor model R0 is set to decrease as the element temperature increases, thereby enabling to represent the temperature dependence peculiar to the split gate-type MONOS non-volatile memory.

FIG. 8 is a diagram for explaining the characteristics of the element model 1 according to the embodiment 1, when the temperature increases/decreases. FIG. 8 is a diagram illustrating a comparison result between the current value represented by the element model 1 according to the embodiment 1 including the variable resistor model R0 having the first to fourth characteristics and the actual measurement value of the cell current of the memory element and a comparison result between the current value represented by the element model 100 according to the comparative example and the actual measurement value of the cell current of the memory element.

As illustrated in FIG. 8, in the element model 100 according to the comparative example, when a model rep-resenting the cell current at a room temperature is formed, the temperature characteristics other than the room temperature cannot be represented, even by adjusting the temperature dependence parameter of the transistor model included in the model. That is, in the element model 100 according to the comparative example, it is not possible to represent the temperature dependence of the cell current. This is because the element model 100 according to the comparative example is configured only with the transistor model, and the resistance of the gap region has a temperature characteristic different from the temperature characteristic of the transistor. In the element model of the memory element according to the embodiment 1, the temperature dependence peculiar to the resistance of the gap region is represented in the variable resistance model R0. Thus, the temperature dependence of the cell current can be represented, as illustrated in FIG. 8. Therefore, the second problem can be solved in the element model 1 according to the embodiment 1.

In the element model 1 according to the embodiment 1, the second problem is solved using an easy method including adding of the above-described variable resistor model R0 representing a few factors which are specified as dominant factors by the inventors. Thus, for the selection gate transistor model MSG and the memory gate transistor model MMG, the existing form of the MOSFET model, such as BSIM4, can be used as is. Thus, there is no need to change the simulation method, that is, there is no need to correct the circuit simulation that is required at the time of using the MOSFET whose form is not the existing form. Therefore, it is possible to simultaneously solve the first problem and the third problem in the element model 1 according to the embodiment 1.

Descriptions will now be made to an example in which a model corresponding to an erase state and a model corresponding to a write state are configured using the element model 1 according to the embodiment 1.

Based on an analysis result using a two-dimensional device simulator, there is found a characteristic that the parasitic resistance formed in the vicinity of the gap region is greater in a case where electrons are accumulated in the charge trap layer than in a case where electrons are not accumulated. This is because the electrons accumulated in the charge trap layer cause to decrease the potential in the vicinity of the gap region, and the parasitic resistance formed in the vicinity of the gap region is increased.

As a result, due to the parasitic resistance of the gap region, the first to fourth characteristics regarding the cell current of the split gate-type MONOS non-volatile memory element are also remarkable in the write state where many electrons are accumulated in the charge trap layer. On the contrary, the first to fourth characteristics become poor in a state where holes are accumulated in the charge trap layer or in the erase state where the electrons accumulated in the write state are electrically neutralized by injection of holes.

Therefore, when to generate one model from another model, of a model representing the cell current in the erase state and a model representing the cell current in the write state, it is effective to change the variable resistor model R0 representing the parasitic resistance in the gap region, in addition to changing one or both of model parameters of the selection gate transistor model and the memory gate transistor model, specifically changing a parameter of the transistor model, for example, BSIM. At this time, in the bias region where the parasitic resistance in the gap region has a great influence at least on the cell current in the write state, the resistance value represented by the variable resistor model R0 in the model representing the cell current in the write state is set to a value greater than the resistance value represented by the variable resistor model R0 in the model representing the cell current in the erase state. This relation will be illustrated in FIG. 7.

In this embodiment, when to generate one model from another model, of the model representing the cell current in the erase state and the model representing the cell current in the write state, the resistance value represented by the variable resistor model R0 is changed, in addition to changing one or both of model parameters of the selection gate transistor model and the memory gate transistor model. Thus, it is possible to more directly represent a change between the write state and the erase state in the physical property of the parasitic resistance in the gap region. This parasitic resistance has an influence on a difference between the cell current in the erase state and the cell current in the write state.

As a result, in the element model 100 according to the comparative example, the problem of the fourth characteristic is solved, because there is made only a small change in one or both of parameters of the selection gate transistor model and the memory gate transistor model, of the model representing the cell current in the erase state and the model representing the cell current in the write state, as compared with a case where to generate one model from another model.

In the present invention, when to generate one model from another model, of the model representing the cell current in the erase state and the model representing the cell current in the write state, the model parameter of the transistor which is simultaneously changed with change of the variable resistor model R0 mainly includes a parameter regarding the threshold voltage of the memory gate transistor model and a parameter regarding carrier mobility or carrier saturation speed of the memory gate transistor model. However, other model parameters may somehow be adjusted.

The element model 1 according to the above-described embodiment 1 is used for simulating an operation of a memory element storing data in the non-volatile memory, on the design supporting device which simulates the operation of the circuit. Particularly, this element model is used for simulating the operation of the memory element having the selection gate and the memory gate on the design supporting device which simulates the operation of the circuit.

In the element model 1 according to the embodiment 1, in the selection gate transistor model MSG, a selection gate voltage Vsg is applied to the selection gate SG, and a drain voltage Vd is applied to the drain of the selection gate transistor model as the drain of the memory element. The source of the memory gate transistor model MMG is the source of the memory element, and a source voltage Vs is applied thereto. A variable resistor model R0 is provided between the source of the selection gate transistor model MSG and the drain of the memory gate transistor model MMG. A back gate voltage Vb is applied to the back gate of the selection gate transistor model MSG and the back gate of the memory gate transistor model MMG.

In the element model 1 according to the embodiment 1, the selection gate transistor model MSG, the memory gate transistor model MMG, and the variable resistor model R0 are models representing the characteristics of the MOSFET, and have an element parameter based on, for example, the BSIM (Berkeley Short-channel IGFET Model). However, they may be based on any other parameter system representing the characteristics of the MOSFET, such as Hisim.

In the invention described inn the above-described embodiment, the variable resistor model R0 having bias dependence is inserted between the memory gate transistor model MMG and the selection gate transistor model MSG of the non-volatile memory. As a result, it is possible to accurately represent the characteristics of the cell current of the non-volatile memory.

In the invention described in this embodiment, particularly, based on the analysis of the two-dimensional device simulation and the actual measurement value, the features of the temperature dependence and the bias dependence of the parasitic resistance in the gap region are reflected to the variable resistor model R0. As a result, unlike the conventional element model, it is possible to realize with high accuracy the features of the cell current of the non-volatile memory, regardless of the simple configuration in which one variable resistor model is simply added to two general transistor models.

The invention described in this embodiment has a simple configuration in which one variable resistor model is added to two general transistor models, and in which any particular change is made to the form of the transistor model, such as the model expression of the transistor model. Thus, the circuit simulator does not need to correspond to some particular transistor model, and it is possible to realize with high accuracy the characteristics of the cell current of the non-volatile memory by also the circuit simulator.

The invention described in this embodiment does not use the particular transistor model, thereby attaining the same stability or convergence of calculation as that of the general transistor model.

Accordingly, it is possible to enhance the accuracy of the simulation, by using the element model 1 which can attain the simulation result highly matching with a measurement result of the actual device, with respect to the selection gate voltage Vsg applied to the memory element and the memory gate voltage Vmg or a fluctuation in the temperature. A failure of a semiconductor device to be manufactured can be solved in advance at the time of designing, by reducing a difference between the assumption at the time of designing and the characteristic of the actual device. The element model 1 according to the embodiment 1 is used, thereby enhancing a reduction in a development period and reliability of the semiconductor device.

Embodiment 2

In the embodiment 2, descriptions will now be made to a more specific configuration example than the element model 1 according to the embodiment 1. In the descriptions of the embodiment 2, the constituent elements described in the embodiment 1 are identified by the same reference symbols as those of the embodiment 1, and thus will not be described over and over.

Figure 9:
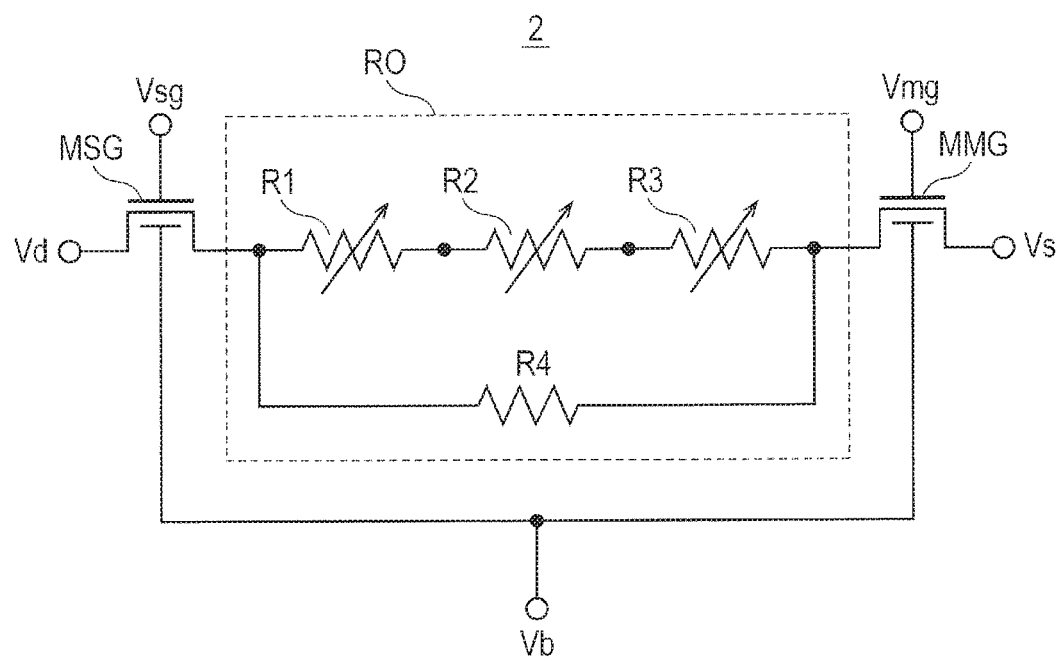
FIG. 9 is a diagram for explaining an element model of a memory element according to an embodiment 2.
Figure 11:
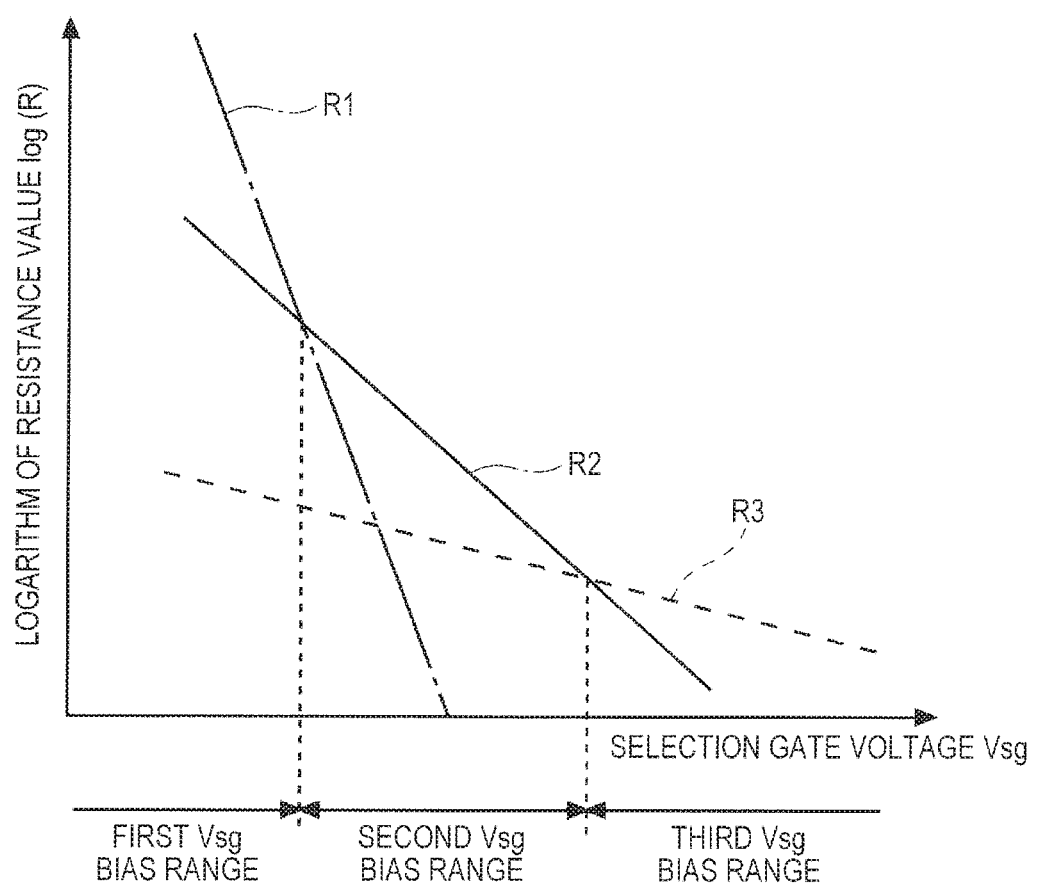
FIG. 11 is a diagram for explaining the selection gate voltage dependence of three variable resistors in the element model of the memory element according to the embodiment 2.

FIG. 9 is a diagram for explaining an element model 2 according to the embodiment 2. As illustrated in FIG. 9, in the element model 2 according to the embodiment 2, the variable resistor model R0 is configured using a plurality of resistors or variable resistors. Specifically, in the embodiment 2, the variable resistor model R0 is configured using a combined resistor of the first variable resistor model to the third variable resistor model which are coupled to each other in series (for example, a variable resistor model R1, a variable resistor model R2, and a variable resistor model R3), and a fixed resistor model R4.

As the characteristic of the dependence of the gap region parasitic resistance on the selection gate voltage Vsg, it tends to depend strongly on the selection gate voltage Vsg of the gap region parasitic resistance when the selection gate voltage Vsg is low, and it tends to depend weakly on the selection gate voltage Vsg of the parasitic resistance when the selection gate voltage Vsg is high. Plotting is made, when the horizontal axis represents Vsg, while the vertical axis represents the logarithm of the gap region parasitic resistance. In this case, the slope is gentle, as the selection gate voltage Vsg increases. As described in FIG. 3, the variable resistor model R0 of the element model 1 according to the embodiment 1 represents the above-described dependence of the gap region parasitic resistance on the selection gate voltage. In more specific, in the embodiment 2, the dependence of the gap region parasitic resistance on the selection gate voltage, by a plurality of variable resistors having different levels of dependence on the selection gate voltage Vsg.

The fixed resistor model R4 is a resistance model which is parallelly coupled to the variable resistor models R1 to R3, and has a resistance value set in advance thereto. The fixed resistor model is a bypass resistor for preventing that the resistance value of the variable resistor model R0 becomes too high and that the circuit simulation becomes unstabilized, when the value of the combined resistor including serially coupled variable resistor models R1 to R3 becomes high. The resistance value of the fixed resistor model R4 is set to a value from, for example, 1 GΩ to 100 TΩ, that is, typically set to approximately 1 TΩ. The bypass resistor may parallelly be coupled to each of or a part of the variable resistor models R1 to R3. Even in this case, the same effect as the fixed resistor model R4 can be attained. When the bypass resistor is parallelly coupled to each of or a part of the variable resistor models R1 to R3, the fixed resistor model as a bypass resistor R4 which is parallelly coupled to the serial-coupling may be excluded. The fixed resistor R4 is added for the purpose of stabilizing the circuit simulation. Thus, the fixed resistor model R4 may be excluded when stable simulation can be performed even without the fixed resistor model R4, depending on the actual resistance value of the variable resistance models R1 to R3 or the bias condition or circuit operation condition at the time of performing the actual simulation.

Subsequently, descriptions will now be made to those characteristics set for the variable resistor models R1 to R3. FIG. 10 is a diagram for explaining the memory gate voltage dependence and the temperature dependence of three variable resistors included in the element model of the memory element according to the embodiment 2.

As illustrated in FIG. 10, the variable resistor models R1 to R3 are resistors having dependence on the selection gate voltage Vsg, and have a resistance value which increases in accordance with a decrease in the selection gate voltage Vsg. The sensitivity "α" shown in Equation (5) differs between the variable resistor model R1, the variable resistor model R2, and the variable resistor model R3. The values of sensitivity are set smaller sequentially in the order of the variable resistor model R1, the variable resistor model R2, and the variable resistor model R3, based on a comparison at the time of the constant selection gate voltage Vsg.

Typically, of the models R1, R2, and R3, the model R1 has the highest value, in a first Vsg bias region including the range of the constant selection gate voltage Vsg, as illustrated in FIG. 1i. In a second Vsg bias region where the selection gate voltage Vsg is greater than that in the first Vsg bias region, of the models R1, R2, and R3, the model R2 has the highest value. In a third Vsg bias region where the selection gate voltage Vsg is greater than that in the second Vsg bias region, the model R3 has the highest value.

In the memory gate voltage Vmg in the voltage range where a read operation is performed for at least the memory cell, the resistance value of the variable resistor model R1 is the highest in the region where the selection gate voltage Vsg is the lowest, and the resistance value of the variable resistor model R3 is the highest in the region where the selection gate voltage Vsg is the highest. The resistance value of the variable resistor model R2 is the highest in the range of the selection gate voltage Vsg corresponding to a midpoint between the range of the selection gate voltage Vsg in which the resistance value of the variable resistor model R1 is the highest and the range of the selection gate voltage Vsg in which the resistance value of the variable resistor model R3 is the highest.

For descriptions of the channel resistance represented by the variable resistor models R1 to R3, FIG. 12 is a diagram for explaining field differences due to differences in the selection gate voltages of the memory element according to the embodiment 2.

Typically, as illustrated in the upper illustration of FIG. 12, the variable resistor model R2 represents the channel resistance, when the dependence of the potential in the gap region on the selection gate voltage Vsg is weaker than the dependence of the potential of the silicon substrate 10 right below the selection gate SG on the selection gate voltage, due to the great influence of the electric line of force from the selection gate SG.

Typically, as illustrated in the lower illustration of FIG. 12, when there is formed the inversion layer below the selection gate SG, the variable resistor model R3 represents that the dependence of the potential in the gap region on the selection gate voltage is further weaker than the component represented by the variable resistor model R2. That is, in the bias range where the variable resistor model R3 is in charge of the resistance of the gap region, the inversion layer is formed in the lower part of the selection gate SG. Thus, the electric field from the selection gate SG is masked by the inversion layer below the selection gate. As a result, the electric field from the selection gate SG wraps around the gap region, thus resulting in weakening the function of fluctuating the potential of the gap region.

The variable resistor model R1 is typically a correction component for the resistance right below the selection gate SG, and has the dependence on the selection gate voltage, with the same level or a little lower than the dependence of the channel resistance right below the selection gate on the selection gate voltage. Note, however, that these effects are distributed to the number of resistors which is different from the number of the above, by amounts different from the above, to represent the resistance in the gap region.

As illustrated in the upper illustration of FIG. 10, the variable resistor models R1 to R3 are formulated in a manner that the resistance value becomes high, as the memory gate voltage Vmg is low. Alternately, at least the variable resistor model R2 is formulated in a manner that the resistance value becomes high, as the memory gate voltage Vmg is low.

In the region where the selection gate voltage Vsg is high, modeling of the resistance in the gap region is performed to reduce the dependence of the gap resistance on the memory gate voltage Vmg, as compared with the region where the selection gate voltage Vsg is low. This is an operation based on an analysis result of the actual measurement value of the cell current.

When carriers TE are trapped, it is acknowledged that the pinch off resistance in the saturation region of the memory gate MG is increased. Note that the carriers TE are localized in the upper part of the charge trap layer in a position close to the gap region in the lower part of the memory gate MG. This effect may also be included in the variable resistors R1 to R3, typically the resistor R3.

As illustrated in the lower illustration of FIG. 10, the variable resistor models R1 to R3 are formulated in a manner that the resistance value becomes high, as the temperature is low. For example, the formulation is made to realize the actual measurement value using the model expressions from Equations (8) to (10).

$$R1 = f_{11}(Vsg) * g_1(Vmg) * h_1(T) \tag{8}$$

$$R2 = f_{11}(Vsg) * g_2(Vmg) * h_2(T) \tag{9}$$

$$R3 = f_{13}(Vsg) * g_3(Vmg) * h_3(T) \tag{10}$$

In Equations (8) to (10), "T" represents the temperature. "$f_{11}$ (Vsg)", "$f_{12}$ (Vsg)", and "$f_{13}$ (Vsg)" are functions decreasing with respect to an increase in Vsg. "$g_1$ (Vmg)", "$g_2$ (Vmg)", and "$g_3$ (Vmg)" are functions decreasing with respect to an increase in Vmg. "$h_1$ (T)", "$h_2$ (T)", "$h_3$ (T)" are functions decreasing with respect to an increase in the temperature.

"$f_{11}$ (Vsg)", "$f_{12}$ (Vsg)", and "$f_{13}$ (Vsg)" in Equations (8) to (10) are expressed, for example, as follows.

$$f_{11}(Vsg) = \exp(-A11 * Vcg + B11) \tag{11}$$

$$f_{12}(Vsg) = \exp(-A12 * Vcg + B12) \tag{12}$$

$$f_{13}(Vsg) = \exp(-A13 * Vcg + B13) \tag{13}$$

In this case, "A11", "A12", "A13", "B11", "B12", and "B13" are constants. Specifically and typically, "A11" and "A12" are positive constants, while "A13" is a positive constant or zero. Typically, "A11" is greater than "A12", and "A12" is greater than "A13".

In general, as functions satisfying the requirements of the invention, it is possible to use Equations (14) to (16).

$$R1 = f_{21}(Vcg, Vmg, T) \tag{14}$$

$$R2 = f_{22}(Vcg, Vmg, T) \tag{15}$$

$$R2 = f_{23}(Vcg, Vmg, T) \tag{16}$$

In this case, $f_{21}$ (Vcg, Vmg, T), $f_{22}$ (Vcg, Vmg, T), $f_{23}$ (Vcg, Vmg, T) are functions decreasing with respect to an increase in "Vcg", functions decreasing with respect to an increase in the memory gate voltage Vmg, and functions decreasing with respect to an increase in the temperature.

In Equations (14) to (16), $f_{21}$ (Vcg, Vmg, T), $f_{22}$ (Vcg, Vmg, T), $f_{23}$ (Vcg, Vmg, T) are functions having the characteristics that can be represented as follows, when the memory gate voltage Vmg and the temperature T are constant values corresponding to the typical memory cell operation.

$$f_{21}(Vsg) = \exp(-A21 * Vcg + B21) \tag{17}$$

$$f_{22}(Vsg) = \exp(-A22 * Vcg + B22) \tag{18}$$

$$f_{23}(Vsg) = \exp(-A23 * Vcg + B23) \tag{19}$$

In this case, "A21", "A22", "A23", "B21", "B22", and "B23" are constants. Specifically and typically, "A21" and "A22" are positive constants, and "A23" is a positive constant or zero. Typically, "A21" is greater than "A22", and "A22" is greater than "A23".

The memory gate voltage Vmg corresponding to a typical memory cell operation is, for example, zero volt, and the temperature T corresponding to the typical memory cell operation is, for example, 25 degrees Celsius. The memory gate voltage Vmg and the temperature T may be constant values corresponding to the typical memory cell operation, in association with the relation of the models R1, R2, and R3. In this case, in the first Vsg bias region including a constant selection gate voltage Vsg range, of "$f_{21}$", "$f_{22}$", and "$f_{23}$", "$f_{21}$" is the highest. In addition, in the second Vsg bias region as a bias range where the selection gate voltage Vsg is higher than that in the first Vsg bias region, of "$f_{21}$", "$f_{22}$", and "$f_{23}$", "$f_{22}$" is the highest.

Further, in the third Vsg bias region as a bias range where the selection gate voltage Vsg is higher than that in the second Vsg bias region, of "$f_{21}$", "$f_{22}$", and "$f_{23}$", and "$f_{23}$" is the highest. The value of R3 is smaller than those of R1 and R2. Thus, in place of Equations (10) and (16), the value of R3 may be replaced by a small constant or zero.

In this embodiment, the channel resistance in the sub-threshold region of the selection gate transistor is fitted by a function shown in Equation (20), and the value of "A22" of Equation (18) is set to a value smaller than Ach of Equation (20).

$$Rch = \exp(-Ach * Vcg + Bch) \tag{20}$$

As a result, the variable resistor R0 is changed more weakly than the dependence of the channel resistance in the selection gate transistor in the sub-threshold region of the selection gate transistor, on the selection gate voltage Vsg, in accordance with a change in the selection gate voltage Vsg.

Particularly, the range of the selection gate voltage Vsg which includes a threshold voltage of the selection gate transistor is assumed as the second Vsg bias region. Then, an inversion layer is formed in the selection gate transistor, but not formed in the gap region. As a result, it is possible to represent that the parasitic resistance of the gap region is increased, and the dependence of the parasitic resistance in the gap region on the selection gate voltage Vsg is weaker than the dependence of the channel resistance of the selection gate transistor in the sub-threshold region of the selection gate transistor on the selection gate voltage Vsg.

Also in the element model 2 according to the embodiment 2, it is preferred to remarkably change the resistance value of the variable resistor models R1 to R3, in the write state and the erase state. FIG. 13 is a diagram illustrating a comparison of the resistance characteristics of the variable resistors used in the memory element according to the embodiment 2, in the write state and the erase state.

The upper illustration of FIG. 13 illustrates a first example, in which the resistance values of the variable resistor models R1 to R3 in the erase state are lower than those of the variable resistor models R1 to R3 in the write state. The lower illustration of FIG. 13 illustrates a second example, in which the values of the variable resistor models R1 to R3 in the erase state are constant values lower than the resistance values of the variable resistor models R1 to R3 in the write state. Though no illustration is given to the example in which the values of the variable resistor models R1 to R3 are constant values in the erase state, the values of the variable resistor models R1 to R3 may be zero. In this manner, the resistance values of the variable resistor models R1 to R3 in the erase state are made lower than those in the write state, thereby reducing the effect of the variable resistor models R1 to R3 on the element model 1.

As described above, in the embodiment 2, a plurality of variable resistor models are combined, thereby easily configuring a model satisfying the conditions of the variable resistor model R0 of the element model 1 according to the embodiment 1. In addition, it is possible to improve the simulation accuracy similarly to the embodiment 1.

Two resistors of the variable resistor models R1 to R3 may be represented in the form of one resistor which is formed with two resistors. In this case, the serially coupled two resistors are coupled parallelly to the fixed resistor model R4 in FIG. 9. The variable resistor models R1 to R3 may be represented in the form of one resistor which is formed with three resistors. In this case, one resistor is parallelly coupled to the fixed resistor model R4 in FIG. 9. For example, for precision modeling, at least one of the variable resistor models R1 to R3 may further be divided into a plurality of serially coupled resistor models. In this case, four or more serially coupled resistors are coupled parallelly to the fixed resistor model R4. For stabilization of the simulation, the parallel resistors other than fixed resistor model R4 may be added. For example, to any of the variable resistor models R1 to R3, the fixed resistor model may be coupled parallelly to any of them.

In place of the variable resistor models R1 to R3, when only two variable resistor models R1 and R2 are used, the absolute values ($|\Delta R0/\Delta Vsg|$) of a change rate of the parasitic resistance value with respect to the change of the selection gate voltage Vsg is set smaller sequentially in the order of the variable resistor model R1 and the variable resistor model R2, based on a comparison at the time of the constant selection gate voltage Vsg. In this case, the variable resistor model R1 has the absolute value which is greater than that of the variable resistor model R2, when the selection gate voltage Vsg is lower than that of the variable resistor model R2.

Embodiment 3

In the embodiment 3, descriptions will now be made to an element model 3 as a modification of the element model 2 according to the embodiment 2. In the descriptions of the embodiment 3, the same constituent elements described in the embodiments 1 and 2 are identified by the same reference symbols of the embodiments 1 and 2, and thus will not be described over and over.

Figure 14:
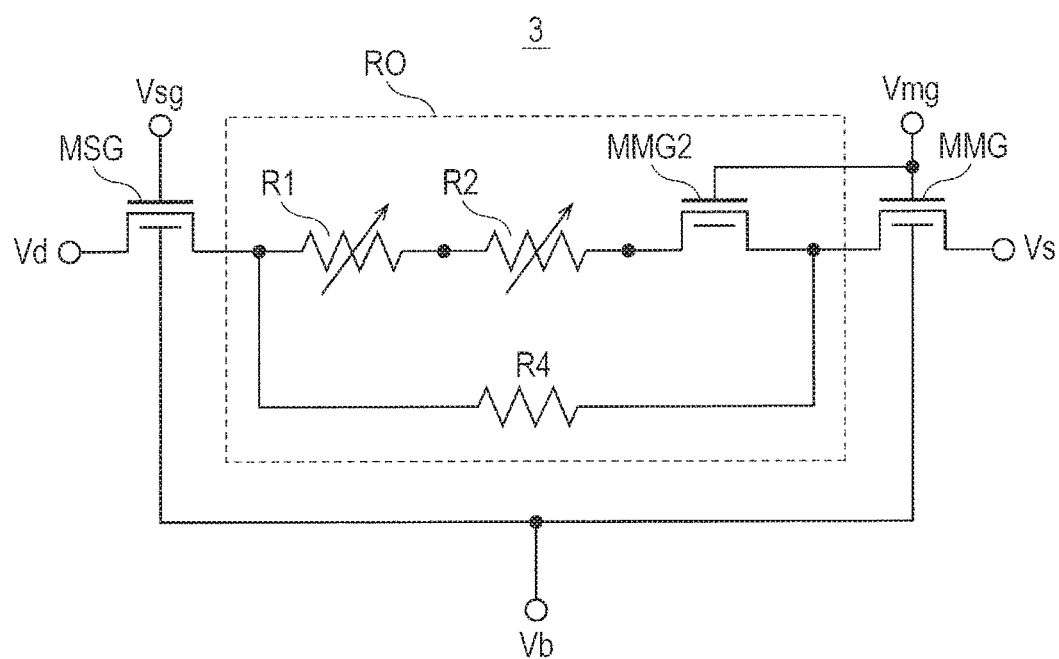
FIG. 14 is a diagram for explaining the characteristics of an element model of a memory element according to an embodiment 3.

FIG. 14 is a diagram for explaining the element model 3 according to the embodiment 3. As illustrated in FIG. 14, in the element model 3 according to the embodiment 3, the variable resistor model R3 according to the embodiment 2 is replaced by a third transistor model (for example, a transistor model MMG2). The source of the transistor model MMG2 is coupled to one end of the variable resistor model R2, while the drain thereof is coupled to the drain of the memory gate transistor model MMG. A memory gate voltage Vmg is applied to the gate of the transistor model MMG2.

In this case, in the transistor model MMG2, the threshold voltage is set greater than the threshold voltage of the memory gate transistor model MMG. As a result, it is possible to represent an increase in the pinch-off resistance of the memory gate transistor, by electrons (electrons positioned in the lower part of the memory gate, of the carriers TE of the upper illustration of FIG. 2) which are localized and trapped in a region closed to the gap region of the memory gate transistor.

As described above, in the element model 3 according to the embodiment 3, it is possible to enhance the accuracy of the circuit simulation by representing the increase in the pinch off resistance of the memory gate transistor.

Embodiment 4

In the embodiment 4, descriptions will now be made to an element model 4 as a modification of the element model 2 according to the embodiment 2. In the descriptions of the embodiment 4, the constituent elements described in the embodiments 1 and 2 are identified by the same reference symbols of the embodiments 1 and 2, and thus will now be described over and over.

Figure 15:
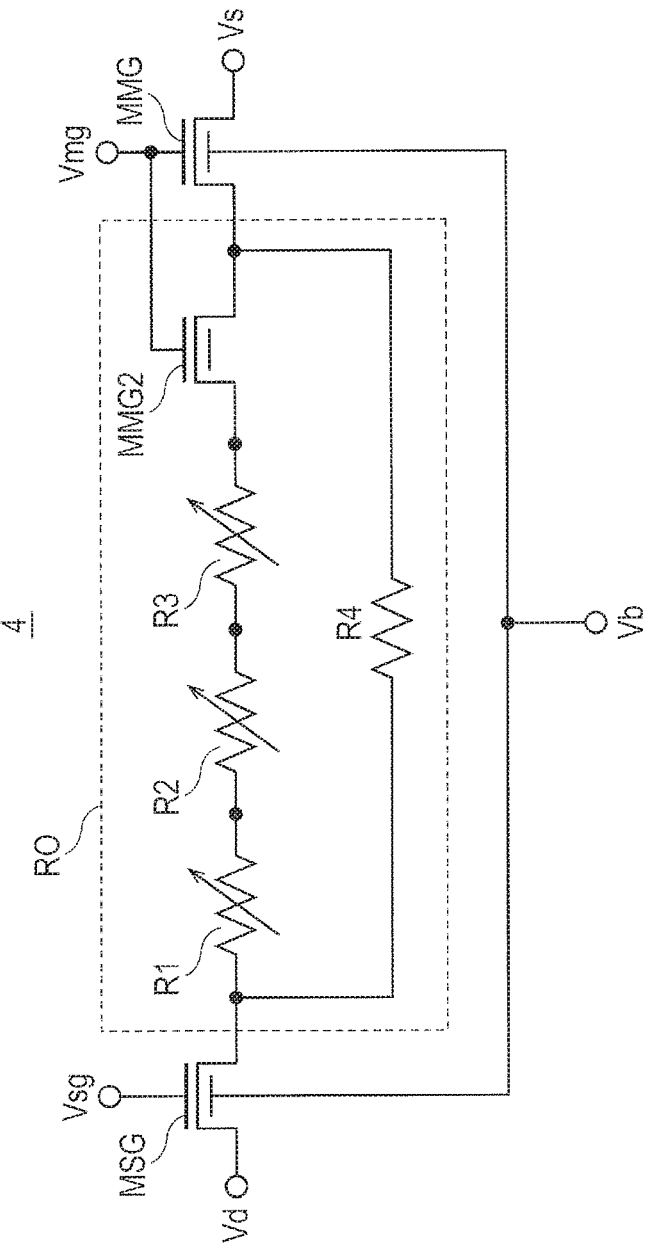
FIG. 15 is a diagram for explaining the characteristics of an element model of a memory element according to an embodiment 4.

FIG. 15 is a diagram for explaining the element model 4 according to the embodiment 4. As illustrated in FIG. 15, in the element model 4 according to the embodiment 4, the third transistor model (for example, the transistor model MMG2) is added to the variable resistor model R0 of the element model 2 according to the embodiment 2. The source of the transistor model MMG2 is coupled to one end of the variable resistor model R3, and the drain thereof is coupled to the drain of the memory gate transistor model MMG. A memory gate voltage Vmg is applied to the gate of the transistor model MMG2.

In the transistor model MMG2, like the embodiment 3, the threshold voltage is set greater than that of the threshold voltage of the memory gate transistor model MMG. This enables to represent the increase in the pinch off resistance of the memory gate transistor by electrons (electrons positioned in the lower part of the memory gate, of the carriers TE of the upper illustration of FIG. 2) which are localized and trapped in a region close to the gap region of the memory gate transistor.

As described above, in the element model 4 according to the embodiment 4, it is possible to enhance the accuracy of the circuit simulation by representing the increase in the pinch off resistance of the memory gate transistor, in addition to the characteristics of the memory element represented by the element model 2 according to the embodiment 2.

Embodiment 5

Figure 16:
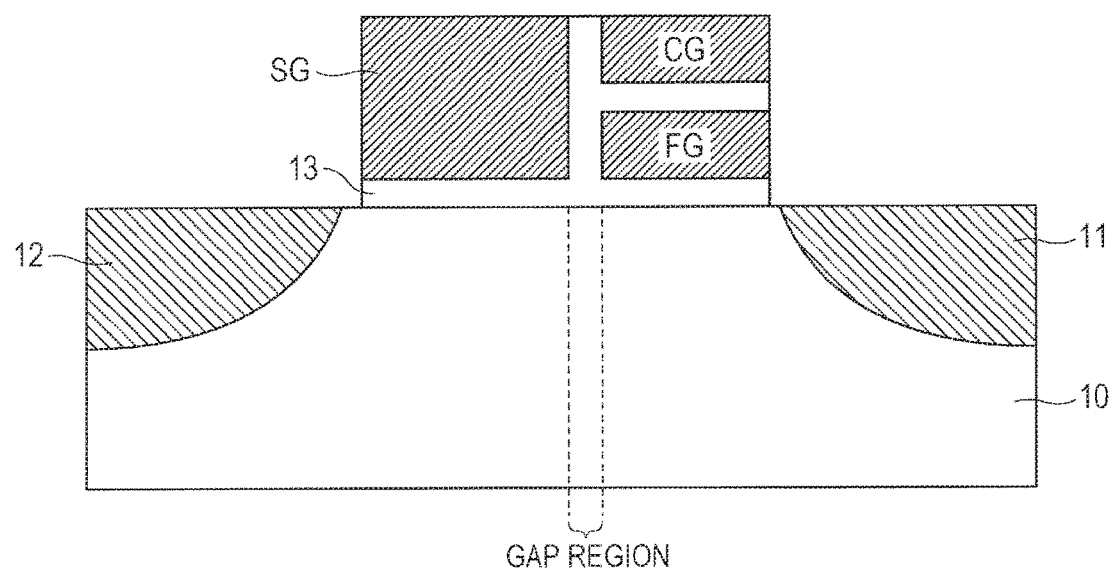
FIG. 16 is a cross sectional view for explaining a memory element according to an embodiment 5.

In the embodiment 5, descriptions will now be made to a model creating method at the time of applying the element model having the variable resistor model R0, for the split gate-type floating gate non-volatile memory. FIG. 16 is a cross sectional view for explaining a memory element according to the embodiment 5.

In the floating gate memory, the silicon substrate 10, the floating gate FG, and the control gate CG are formed to be in contact with each other through the insulating film 13. Thus, even in the floating gate memory, there exists a surface of the silicon substrate 10 which is not covered by any of the floating gate FG or the control gate CG and the selection gate SG. This region serves as a gap region.

Even in this floating gate memory, it is possible to set the variable resistor model R0 corresponding to the gap region, by performing the same examination as that for the embodiments 1 to 4. In the embodiment 5, like the embodiments 1 to 4, the element model 5 using the variable resistor model R0 is formed.

Figure 17:
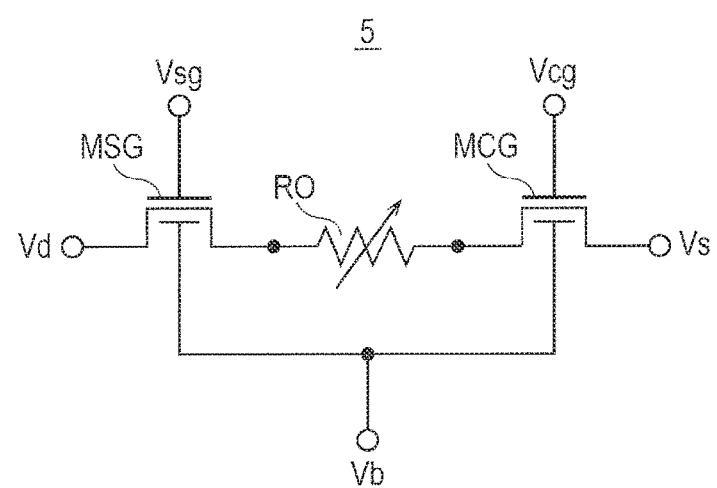
FIG. 17 is a diagram for explaining an element model of the memory element according to the embodiment 5.

FIG. 17 is a diagram for explaining the element model 5 of the memory element according to the embodiment 5. As illustrated in FIG. 17, in the element model 5 of the floating gate memory, the memory gate transistor model MMG of the element model 1 according to the embodiment 1 is replaced by a control gate transistor model MCG. This control gate transistor model MCG corresponds to the memory gate transistor model MMG, and has a parameter based on the BSIM or a parameter of the transistor model, such as Hisim, other than the BSIM.

In the floating gate memory, the floating gate FG has the same function as that of the charge trap layer of the MONOS memory. Thus, the electric field applied to the channel unit by the memory gate explained in FIG. 5 may be replaced by the electric field applied to the channel unit due to the laminated structure of the control gate and the floating gate of the floating gate type memory. Then, it is preferred to examine parameters of the variable resistor model R0 and the control gate transistor model MCG.

The floating gate memory is not to record data by accumulating electrons in the charge trap layer, like the MONOS memory. However, it is possible to apply the present invention, when the parasitic resistance of the gap region which exists between the selection gate and the floating gate like the split gate type MONOS memory is remarkable due to some reason other than accumulation of the electrons in the charge trap layer.

For the split gate memory element other than the MONOS type or floating gate type, when the parasitic resistance of the region sandwiched between two gates has an influence on the element characteristics, the present invention may be applied, by replacing the gate electrode and the names of any other constituent elements described in the present invention by constituent elements corresponding to target semiconductor elements.

Further, in the semiconductor element split gate type memory element, when the parasitic resistance in the region sandwiched by two gates has an influence on the element characteristics, the present invention may be applied, by replacing the gate electrode and the names of any other constituent elements described in the present invention by constituent elements corresponding to target semiconductor elements.

As described above, it is obvious that the idea explained in the embodiment 1 can be applied for the entire split gate type memory having the gap region, by including the variable resistor model R0 in the element model. It is possible to enhance the simulation accuracy of the circuit including the split gate type memory by using the element model of the split gate type memory including the variable resistance model R0.

Embodiment 6

Figure 18:
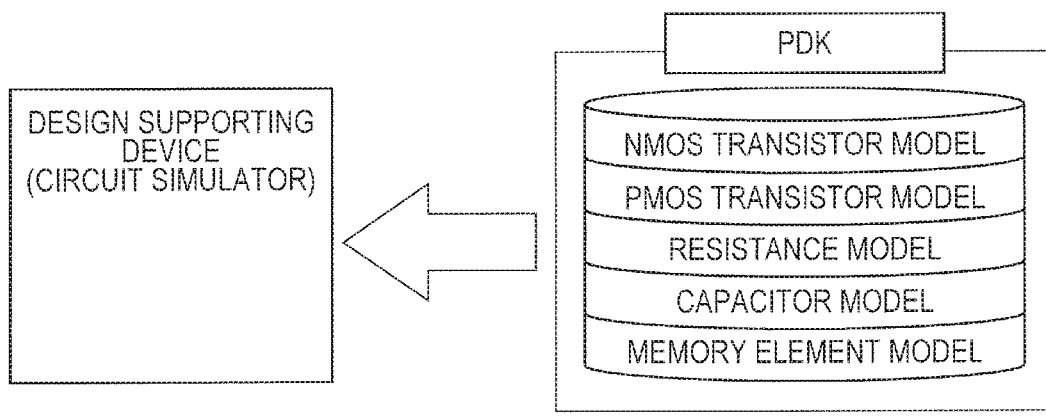
FIG. 18 is a diagram for explaining a design supporting device and a process design kit, according to an embodiment 6.
Figure 19:
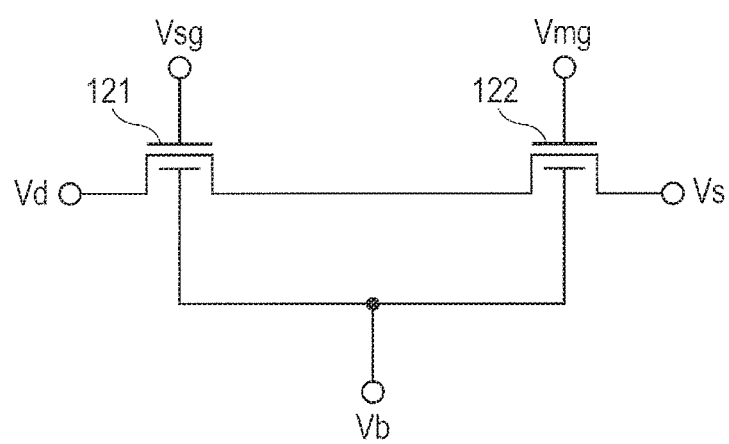
FIG. 19 is a diagram for explaining an element model of a memory element according to Non-patent Literature 1.
Figure 20:
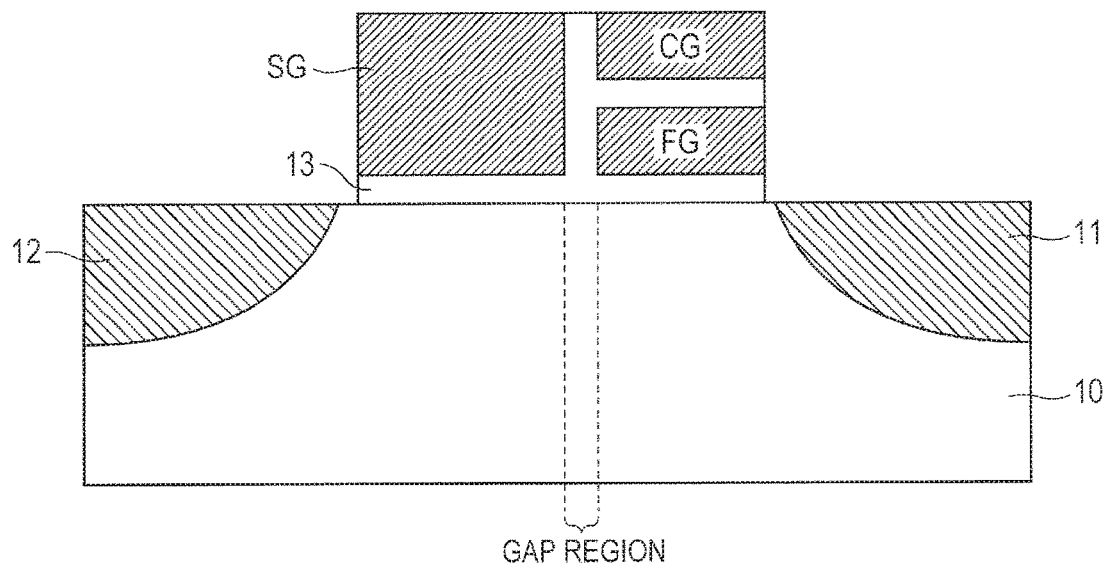
FIG. 20 is a cross sectional view for explaining the main structure of a floating gate-type split gate memory element.
Figure 21:
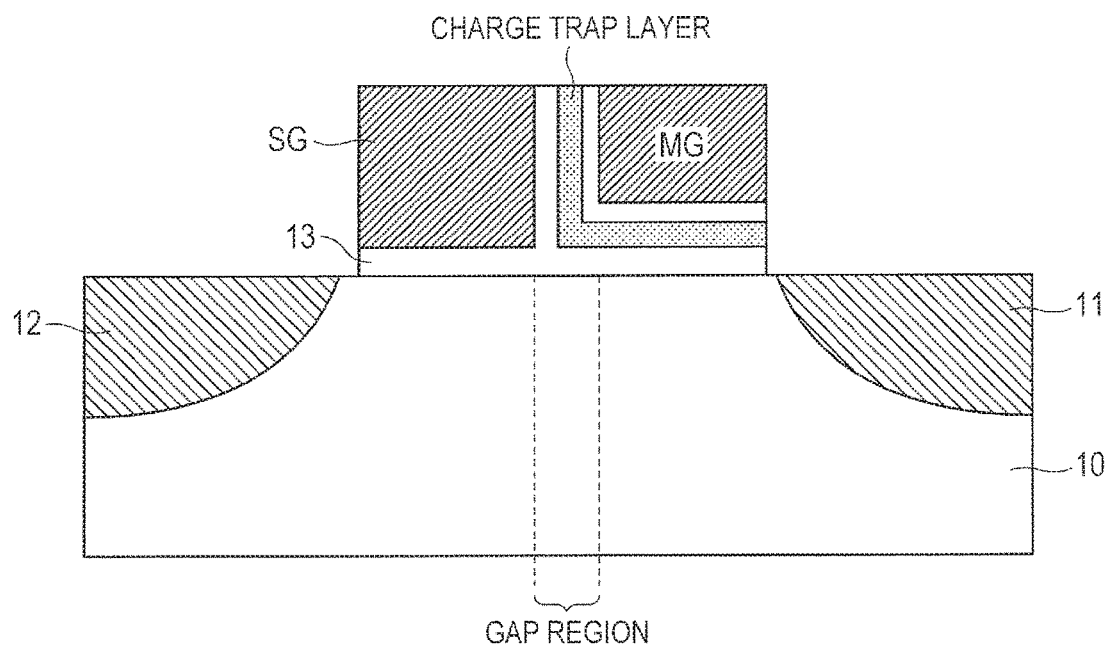
FIG. 21 is a cross sectional view of a memory element disclosed in Non-patent Literature 2.

In the embodiment 6, descriptions will now be made to a process design kit including the element model described in the embodiments 1 to 5. FIG. 18 is a diagram for explaining a design supporting device and a process design kit, according to the embodiment 6.

The design supporting device illustrated in FIG. 18 is, for example, a calculation device which executes a circuit simulation program. The process design kit includes the memory element model including at least one of element models described in the embodiments 1 to 5, in addition to the element model of the general circuit element, for example, the NMOS transistor model, the PMOS transistor model, the resistor model, and the capacitor model.

The design supporting device reads the process design kit stored in the memory device which is provided in the design supporting device or outside the design supporting device, thereby creating a net list of target circuits to be examined and performing simulation of the circuit characteristic using the net list.

The transistor model included in the element model described in the embodiments 1 to 5 can be configured with the parameters based on the BSIM as the existing transistor model or the parameter of the existing transistor model, such as Hisim, other than the BSIM. Thus, because there is no need to introduce any special transistor model, any special corresponding system is not necessary in the design supporting device, and it is possible to perform the reading in the design supporting device, like another element model included in the process design kit.

Accordingly, it is possible to enhance the simulation accuracy of the circuit including the split gate type non-volatile memory, by including the element model described in the embodiments 1 to 5 in the process design kit.

Other Embodiment

In the element model described in the above-described embodiments, the variable resistor model may have bias dependence other than the dependence on the selection gate voltage Vsg or the dependence on the memory gate voltage Vmg, that is, may have dependence on the drain voltage or dependence on the substrate bias.

In the MONOS memory, when holes for data erasure remain in the insulating film, it is possible to reflect the effect to the variable resistor model R0, if it is necessary to consider the influence of the parasitic resistance on the drain current of the memory cell, that is, if the parasitic resistance is high in the gap region due to the remaining holes, or if non-uniform charges remain in the lower part of the memory gate due to the remaining of the holes and the electrons.

In the above descriptions, the memory element using the N-channel transistor has been described. However, it is possible to use the above-described idea, by inverting the polarity in the memory element using the P-channel transistor. The above-described idea can be applied to not only the non-volatile memory formed over a bulk substrate, but also the non-volatile memory formed over a substrate, such as the FINFET or a glass substrate, other than the bulk substrate.

Accordingly, the present invention by the present inventors have specifically been described based on the embodiments. However, the present invention is not limited to the above-described embodiments. Needless to say, various changes may be made without departing from the scope thereof.

What is claimed is:

1. An element model having a selection gate and a memory gate, and used for simulating an operation of a memory element storing data in a non-volatile memory on a design supporting device which simulates an operation of a circuit, the model comprising:
   a first transistor model which simulates a characteristic of a selection gate transistor whose channel resistance is changed by a selection gate voltage applied to the selection gate;
   a second transistor model which simulates a characteristic of a memory gate transistor whose channel resistance is changed by a memory gate voltage applied to the memory gate; and
   a variable resistor model whose resistance value is set to depend both on the selection gate voltage and the memory gate voltage and set to correspond to a gap region formed in a lower part of an insulating film insulating between the selection gate and the memory gate, and wherein the variable resistor model is provided between the first transistor model and the second transistor model.

2. The element model according to claim 1, wherein the resistance value of the variable resistor model is changed more weakly than dependence of the channel resistance in the first transistor model on the selection gate voltage, decreased in accordance with the selection gate voltage, decreased in accordance with an in crease in the memory gate voltage, and decreased in accordance with an increase in a temperature.

3. The element according to claim 1, wherein a characteristic of the variable resistor model is set in a manner that a resistance value in an erase state where no charges are charged in a charge trap layer formed in a lower part of the memory gate transistor is set lower than a resistance value in a write state where the charges are charged in the charge trap layer.

4. The element model according to claim 1, wherein the variable resistor model has a first variable resistor model to a third variable resistor model which are coupled to each other in series;
wherein a resistance value of the first variable resistor model is decreased in accordance with an increase in the selection gate voltage, decreased in accordance with an increase in the memory gate voltage, and decreased in accordance with an increase in a temperature,
wherein a resistance value of the second variable resistor model is decreased in accordance with an increase in the selection gate voltage, decreased with an increase in the memory gate voltage, decreased in accordance with an increase in a temperature, and dependence thereof on the selection gate voltage is weaker than that of the first variable resistor model, and
wherein a resistance value of the third variable resistor model is decreased in accordance with an increase in the selection gate voltage, decreased in accordance with an increase in the memory gate voltage, decreased in accordance with an increase in a temperature, and dependence thereof on the selection gate voltage is weaker than that of the second variable resistor model.

5. The element model according to claim 4, wherein a slope of the third variable resistor model with respect to the memory gate voltage is smaller than that of the first variable resistor model and the second variable resistor model.

6. The element model according to claim 4, further comprising
a fixed resistor model which is coupled parallelly to the first variable resistor model to the third variable resistor model, and in which a predetermined resistance value is set.

7. The element model according to claim 1, wherein the variable resistor model has a first variable resistor model, a second variable resistor model, and a third transistor model,
wherein the first variable resistor model, the second variable resistor model, and the third variable resistor model are coupled to each other in series, and the memory gate voltage is applied to a gate of the third transistor model,
wherein a resistance value of the first variable resistor model is decreased in accordance with an increase in the selection gate voltage, decreased in accordance with an increase in the memory gate voltage, and decreased in accordance with an increase in a temperature, and
a characteristic of the second variable resistor model is decreased in accordance with an increase in the selection gate voltage, decreased in accordance with an increase in the memory gate voltage, decreased in accordance with an increase in a temperature, and dependence thereof on the selection gate voltage is weaker than that of the first variable resistor model.

8. The element model according to claim 7, further comprising
a fixed resistor model which is parallelly coupled to the first variable resistor model, the second variable resistor model, and the third transistor model, and in which a predetermined resistance value is set.

9. The element model according to claim 1, wherein the variable resistor model has a first variable resistor model, a second variable resistor model, a third variable resistor model, and a third transistor model,
wherein the first variable resistor model to the third variable resistor model, and the third transistor model are coupled to each other in series, and the memory gate voltage is applied to a gate of the third transistor model,
wherein a resistance value of the first variable resistor model is decreased in accordance with an increase in the selection gate voltage, decreased in accordance with an increase in the memory gate voltage, and decreased in accordance with an increase in a temperature,
wherein a resistance value of the second variable resistor model is decreased in accordance with an increase in the selection gate voltage, decreased in accordance with an increase in the memory gate voltage, decreased in accordance with an increase in a temperature, and dependence thereof on the selection gate voltage is weaker than that of the first variable resistor model, and
wherein a resistance value of the third variable resistor model is decreased in accordance with an increase in the selection gate voltage, decreased in accordance with an increase in the memory gate voltage, decreased in accordance with an increase in a temperature, and dependence thereof on the selection gate voltage is weaker than that of the second variable resistor model.

10. The element model according to claim 9, further comprising
a fixed resistor model which is coupled parallelly to the first variable resistor model to the third variable resistor model, and the third transistor model, and in which a predetermined resistance value is set.

11. The element model according to claim 1, wherein the first transistor model, the second transistor model, and the variable resistor model have an element parameter based on a BSIM (Berkeley Short-channel IGFET Model).

12. The element model according to claim 1, wherein the element model simulates an operation of a MONOS memory or a floating gate memory.

13. A process design kit used for a design supporting device simulating an operation of an electronic circuit, and including element models of a transistor, a resistor, a capacitor, and a memory element, the element model of the memory element having a selection gate and a memory gate, the process design kit comprising:

a first transistor model which simulates a characteristic of a selection gate transistor whose channel resistance is changed by a selection gate voltage applied to the selection gate;

a second transistor model which simulates a characteristic of a memory gate transistor whose channel resistance is changed by a memory gate voltage applied to the memory gate; and a variable resistor model whose resistance value is set to depend both on the selection gate voltage and the memory gate voltage and set to correspond to a gap region formed in a lower part of an insulating film insulating the selection gate and the memory gate, and wherein the variable resistor model is provided between the first transistor model and the second transistor model.

14. The element model according to claim 1,
wherein the first transistor model, the variable resistor model and the second transistor model are coupled in that order.

15. The process design kit according to claim 13,
wherein the first transistor model, the variable resistor model and the second transistor model are coupled in that order.

\* \* \* \* \*